United States Patent
Hsu et al.

(10) Patent No.: US 9,953,975 B2
(45) Date of Patent: Apr. 24, 2018

(54) METHODS FOR FORMING STI REGIONS IN INTEGRATED CIRCUITS

(71) Applicant: Taiwan Semiconductor Manufacturing Company, Ltd., Hsin-Chu (TW)

(72) Inventors: Chih-Yu Hsu, Xinfeng Township (TW); Yi-Tang Lin, Hsin-Chu (TW); Clement Hsinjen Wann, Carmel, NY (US); Chih-Sheng Chang, Hsin-Chu (TW); Wei-Chun Tsai, Hsin-Chu (TW); Jyh-Cherng Sheu, Hsin-Chu (TW); Chi-Yuan Shih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 604 days.

(21) Appl. No.: 13/946,660

(22) Filed: Jul. 19, 2013

(65) Prior Publication Data

US 2015/0021710 A1 Jan. 22, 2015

(51) Int. Cl.
*H01L 29/49* (2006.01)
*H01L 27/088* (2006.01)
*H01L 21/8234* (2006.01)
*H01L 21/762* (2006.01)

(52) U.S. Cl.
CPC .... *H01L 27/0886* (2013.01); *H01L 21/76224* (2013.01); *H01L 21/823425* (2013.01); *H01L 21/823481* (2013.01)

(58) Field of Classification Search
CPC ......... H01L 27/0886; H01L 21/823425; H01L 21/823481

USPC .......................... 257/401, E21.159, E29.255
See application file for complete search history.

(56) References Cited

U.S. PATENT DOCUMENTS

| | | | |
|---|---|---|---|
| 2009/0206400 A1 | 8/2009 | Juengling | |
| 2011/0095372 A1 | 4/2011 | Yuan et al. | |
| 2011/0210404 A1* | 9/2011 | Su et al. | ......................... 257/401 |
| 2011/0294286 A1* | 12/2011 | Hung | .................... G03F 7/0035 438/587 |

FOREIGN PATENT DOCUMENTS

| | | |
|---|---|---|
| KR | 1020100114503 | 10/2010 |
| KR | 1020100115768 | 10/2010 |
| KR | 1020110049679 | 5/2011 |
| WO | 2009085958 | 7/2009 |

* cited by examiner

Primary Examiner — Michael Shingleton
(74) Attorney, Agent, or Firm — Slater Matsil, LLP

(57) ABSTRACT

A first Fin Field-Effect Transistor (FinFET) and a second FinFET are adjacent to each other. Each of the first FinFET and the second FinFET includes a semiconductor fin, a gate dielectric on sidewalls and a top surface of the semiconductor fin, and a gate electrode over the gate dielectric. The semiconductor fin of the first FinFET and the semiconductor fin of the second FinFET are aligned to a straight line. An isolation region is aligned to the straight line, wherein the isolation region includes a portion at a same level as the semiconductor fins of the first FinFET and the second FinFET. A continuous straight semiconductor strip is overlapped by the semiconductor fins of the first FinFET and the second FinFET. A Shallow Trench Isolation (STI) region is on a side of, and contacts, the semiconductor strip. The isolation region and the first STI region form a distinguishable interface.

20 Claims, 26 Drawing Sheets

METHODS FOR FORMING STI REGIONS IN INTEGRATED CIRCUITS

BACKGROUND

Transistors are key components of modern integrated circuits. To satisfy the requirements of increasingly faster speed, the drive currents of transistors need to be increasingly greater. To achieve this increase in performance, the gate lengths of transistors are constantly being scaled down. Scaling down the gate lengths, however, leads to undesirable effects known as "short-channel effects," in which the control of current flow by the gates is compromised. Among the short-channel effects are the Drain-Induced Barrier Lowering (DIBL) and the degradation of sub-threshold slope, both of which resulting in the degradation in the performance of transistors.

The use of a multi-gate transistor architecture may help the relief of short-channel effects. Fin Field-Effect Transistors (FinFET) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In existing FinFET formation processes, Shallow Trench Isolation (STI) regions are first formed in a silicon substrate. The STI regions are then recessed to form silicon fins, which are the portions of the silicon substrate that are over the recessed STI regions. Next, a gate dielectric, a gate electrode, and source and drain regions are formed to finish the formation of the FinFET. Each of the silicon fins may be used to form a FinFET, although one FinFET may include a plurality of parallel silicon fins. In the respective FinFET, the channel includes both the sidewalls and the top surfaces of the semiconductor fins, and hence the drive current of the FinFET is high with relative to the chip area used by the FinFET. Accordingly, FinFET is becoming a trend in recent generations of integrated circuits.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Fin Field-Effect Transistors (FinFETs) and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

Figure 1:
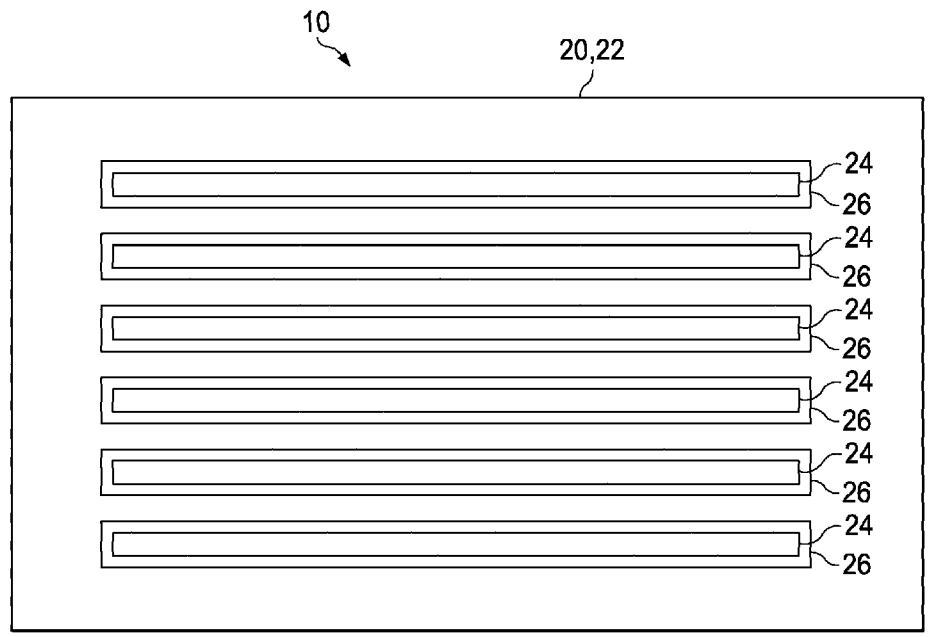
FIGS. 1 through 15 are cross-sectional views, top views, and perspective views of intermediate stages in the manufacturing of Fin Field-Effect Transistors (FinFET) in accordance with some exemplary embodiments.

FIGS. 1 through 15 are cross-sectional views, top views, and perspective views of intermediate structures in the formation of FinFETs in accordance with some embodiments. Referring to FIG. 1, semiconductor wafer 10, which comprises semiconductor substrate 20, is provided. Semiconductor substrate 20 may be formed of silicon or other commonly used semiconductor materials. Hard mask layer 22 (also refer to FIG. 3B) is formed over semiconductor substrate 20. In some embodiments, hard mask layer 22 is a composite layer comprising a plurality of dielectric layers, such as a plasma enhanced oxide layer, a silicon oxynitride layer, an amorphous carbon layer, and/or the like. Patterned Mandrels (which are sacrificial patterns) 24 are formed on hard mask layer 22.

Spacers 26 are formed on the sidewalls of mandrels 24. The formation of spacers 26 includes forming a blanket spacer layer on the top surfaces and the sidewalls of mandrels 24, and then performing an anisotropic etch to remove the horizontal portions of the blanket spacer layer. The vertical portions of the blanket layer on the sidewalls of mandrels 24 form spacers 26. In some exemplary embodiments, mandrels 24 are formed of silicon nitride, although other materials may also be used.

Figure 2:
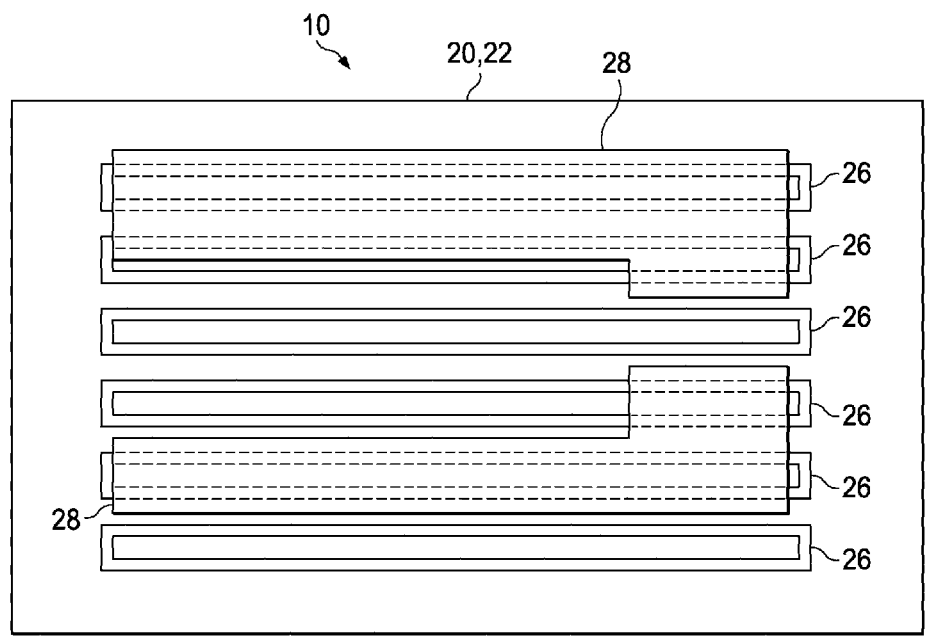
Figure 3A:
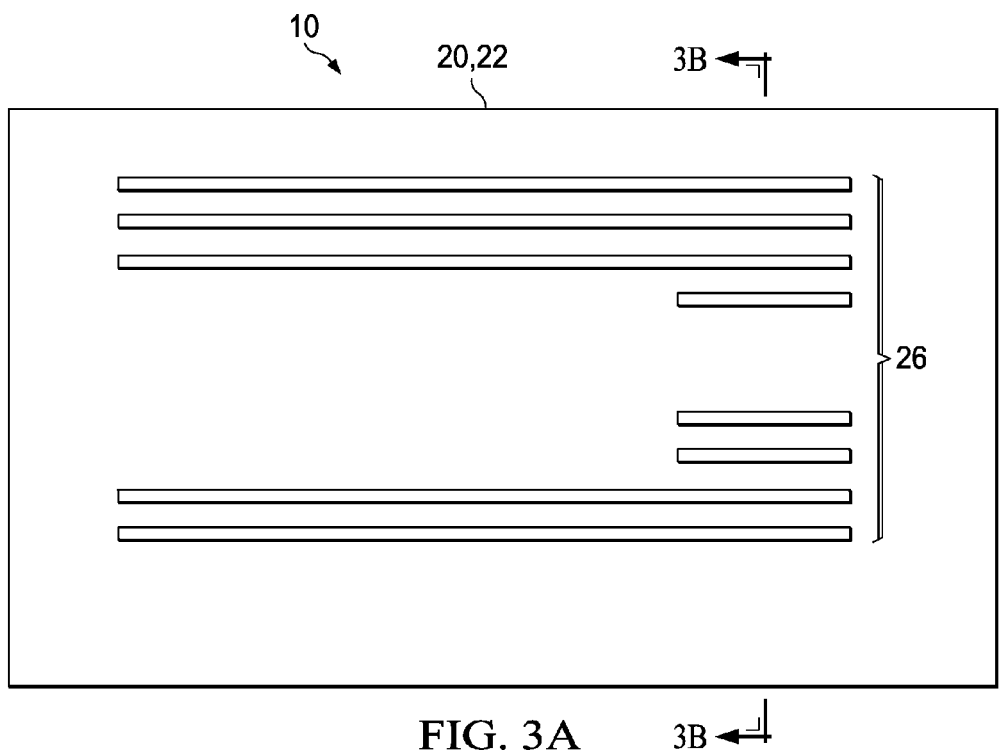
Figure 3B:
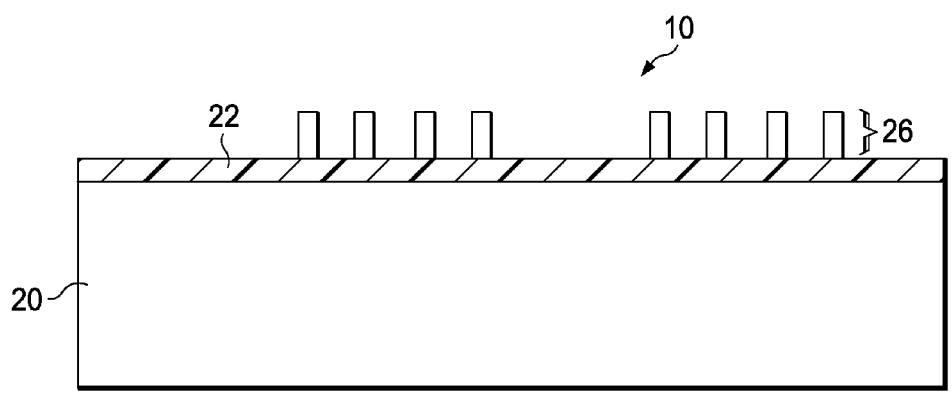

Next, as shown in FIG. 2, mandrels 24 are removed by etching, and spacers 26 are left un-removed. A first photolithography process is performed to pattern spacers 26. For example, as shown in FIG. 2, photo resist 28 is formed to cover some portions of spacers 26, and some other portions of spacers 26 are not covered. The un-covered portions of spacers 26 are then removed by etching. Photo resist 28 is then removed. The resulting structure is shown in FIG. 3A. FIG. 3B illustrates a cross-sectional view of the structure shown in FIG. 3A, wherein the cross-sectional view is obtained from the plane containing lines 3B-3B in FIG. 3A.

Figure 4:
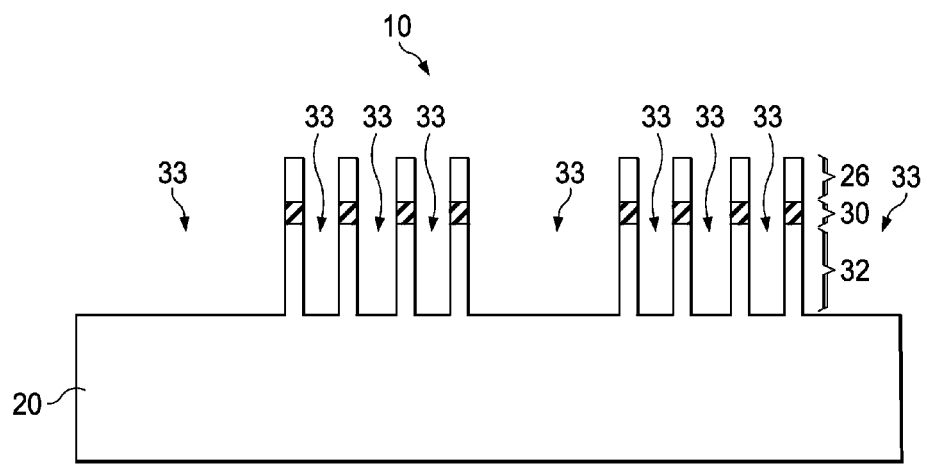

Spacers 26 are used as masks to etch hard mask layer 22 in order to form hard masks 30, and the resulting structure is shown in FIG. 4. Spacers 26 are then removed, and substrate 20 is etched using hard mask 30 as an etching mask. Recesses 33 are formed in substrate 20. The portions of semiconductor substrate 20 between recesses 33 form semiconductor strips 32.

Figure 5A:
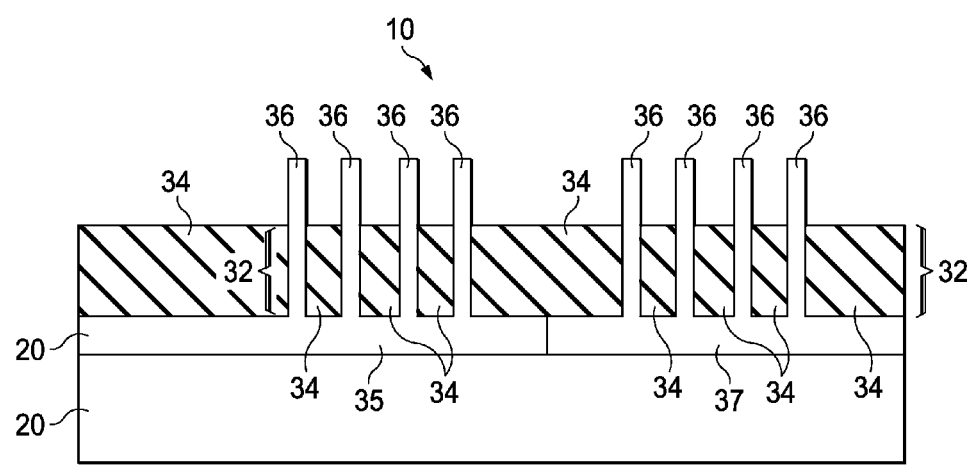
Figure 5B:
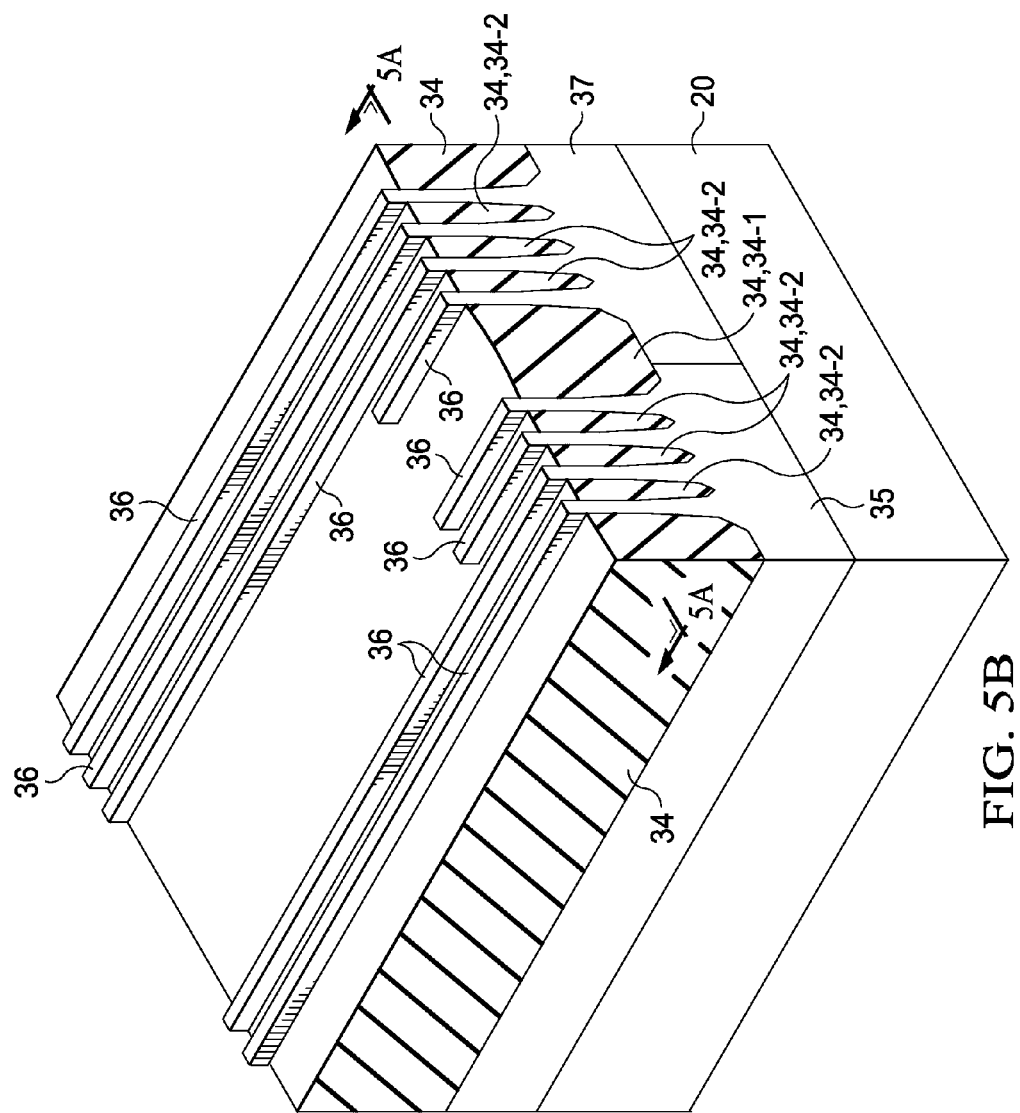

FIG. 5A illustrates the formation of Shallow Trench Isolation (STI) regions 34. In some embodiments, the formation of STI regions 34 include filling dielectric materials into recesses 33 (FIG. 4), and performing a Chemical Mechanical Polish (CMP) to remove excess portions of the dielectric material. The remaining portions of the dielectric materials left by the CMP form STI regions 34. Next, STI regions 34 are recessed in an etching step, so that some portions of semiconductor strips 32 are over the top surfaces of STI regions 34 to form semiconductor fins 36. A perspective view of the structure in FIG. 5A is shown in FIG. 5B, which illustrates fins 36 parallel to each other. Some of fins 36 in FIG. 5B are long fins that are used to form a plurality of FinFETs. In some embodiments, n-well region 35 and p-well region 37 are formed, for example, through implantations.

FIG. 5B illustrates a perspective view of the structure shown in FIG. 5A, wherein the cross-sectional view in FIG. 5A is obtained from the vertical plane containing lines 5A-5A in FIG. 5B. As shown in FIG. 5B, two types of STI regions 34 (including 34-1 and 34-2) are formed simultaneously through a same photolithography process. STI region 34-1 is used for isolating n-well region 35 from p-well region 37, STI regions 34-2 are used for separate neighboring fins 36.

Figure 6:
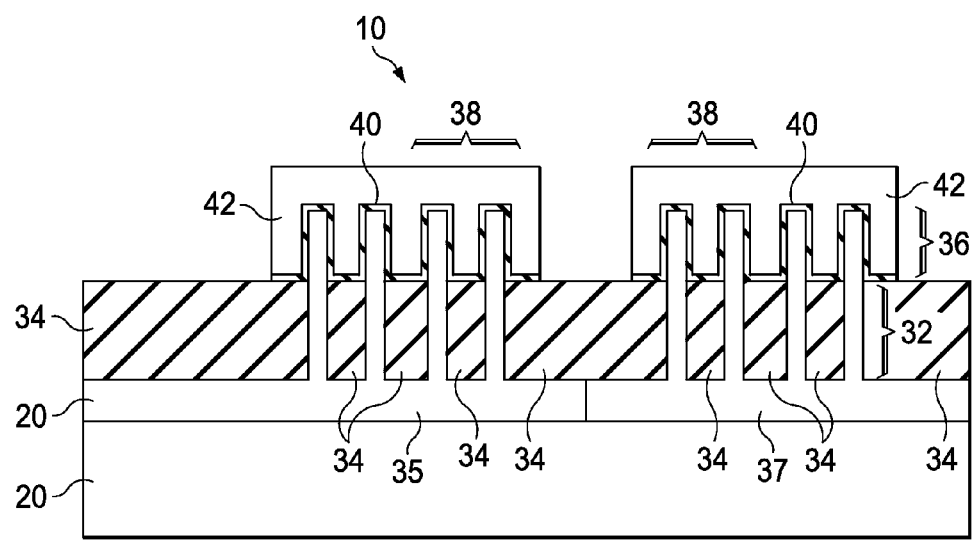

FIG. 6 illustrates the formation of dummy gate stacks 38. The cross-sectional view in FIG. 6 is obtained from the same plane from which the cross-sectional view in FIG. 5A is obtained. In some embodiments, dummy gate stacks 38 include dummy gate dielectrics 40 (which may be interfacial dielectrics formed of silicon oxide, for example), and dummy gate electrodes 42 (polysilicon, for example) over dummy gate dielectrics 40.

Figure 7A:
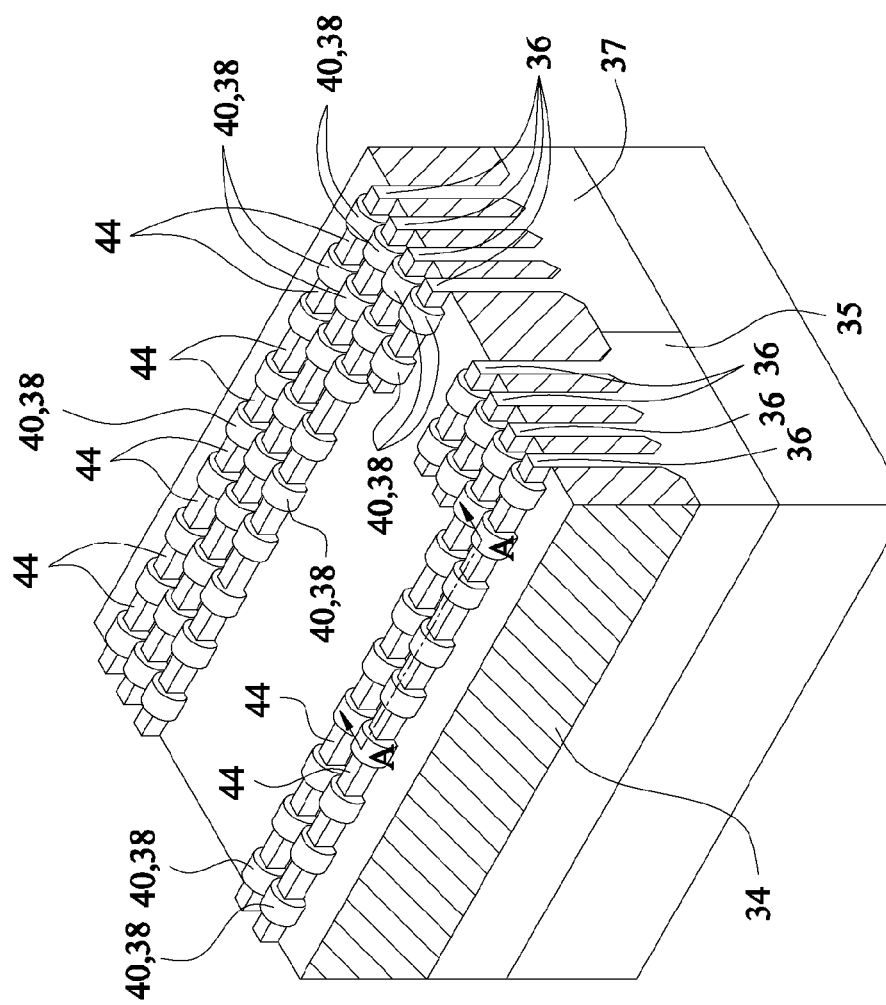
Figure 7B:
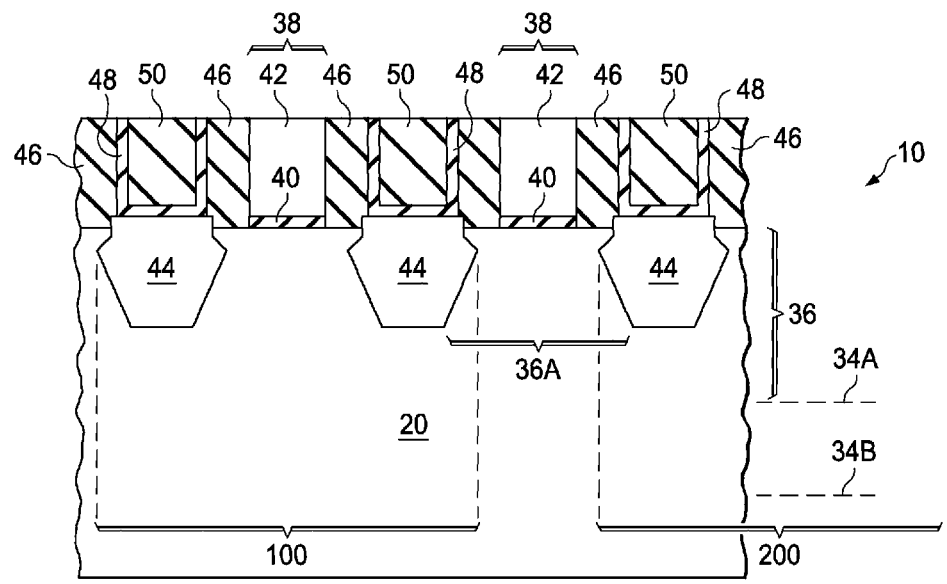

Referring to FIGS. 7A and 7B, which illustrate a perspective view and a cross-sectional view, respectively, after the formation of dummy gate stacks 38, source and drain regions 44, gate spacers 46, Contact Etch Stop Layer (CESL) 48, and Inter-Layer Dielectric (ILD) 50 are formed. Dummy gate electrode 42, gate spacers 46, CESL 48, and ILD 50 are not shown in FIG. 7A for clarity, although they do exist. Throughout the description, unless specified otherwise, the cross-sectional views in subsequent figures may be obtained from the same vertical plane that crosses lines A-A in FIG. 7A. As shown in FIG. 7B, source and drain regions 44 may be formed by recessing fins 36 (FIG. 7A) using gate spacers 46 and dummy gate stacks 38 as etching masks, and epitaxially growing epitaxy semiconductor regions as source/drain regions 44. For forming p-type FinFETs, for example, the fins 36 in n-well region 35 (FIG. 7A) may be recessed, and SiGe may be grown in the recesses for forming p-type FinFETs. Conversely, for forming n-type FinFETs, the fins 36 in p-well region 37 (FIG. 7A) may be recessed, and SiP may be grown in the recesses for forming n-type FinFETs.

Referring to FIG. 7B, gate spacers 46 may be formed, which may comprise silicon nitride, for example. CESL 48 may be formed of a dielectric material such as silicon nitride, silicon oxide, silicon carbide, or the like. ILD 50 may be formed of Phospho-Silicate Glass (PSG), Boro-Silicate Glass (BSG), Boron-Doped Phospho-Silicate Glass (BPSG), or the like. After the formation of ILD 50, a CMP is performed to level the top surfaces of CESL 48, ILD 50, gate spacers 46, and dummy gate electrode 42, as shown in FIG. 7B.

Referring back to FIG. 7A, each of fins 36 have a plurality of dummy gate stacks 38 (represented by dummy gate dielectrics 40, while dummy gate electrodes 42 are not shown) and source/drain regions 44 formed in an alternating pattern. Although each of fins 36 may be used to form a plurality of FinFETs, these FinFETs are not separated from each other yet at this step. For example, in FIG. 7B, the two source/drain regions 44 on the left belong to FinFET 100, and the source/drain region 44 on the right belongs to FinFET 200. At this time, fin portion 36A, which is a portion of semiconductor fin 36, still remains. Fin portion 36A needs to be replaced with an isolation structure (a dielectric material) in order to isolate FinFETs 100 and 200 from each other. FIGS. 8A through 23 illustrate the embodiments for forming the isolation structures.

Figure 8A:
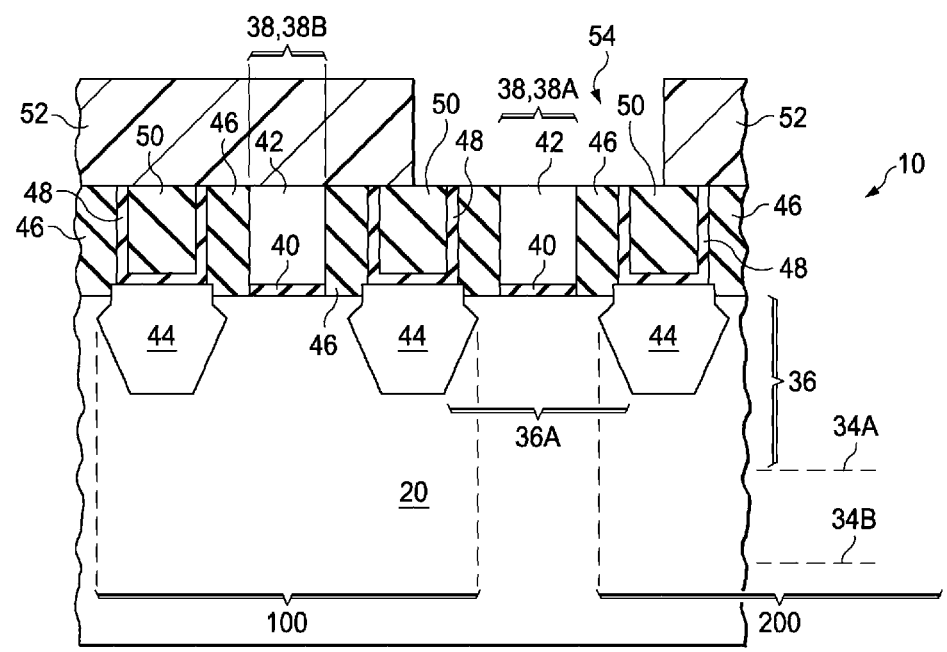
Figure 8B:
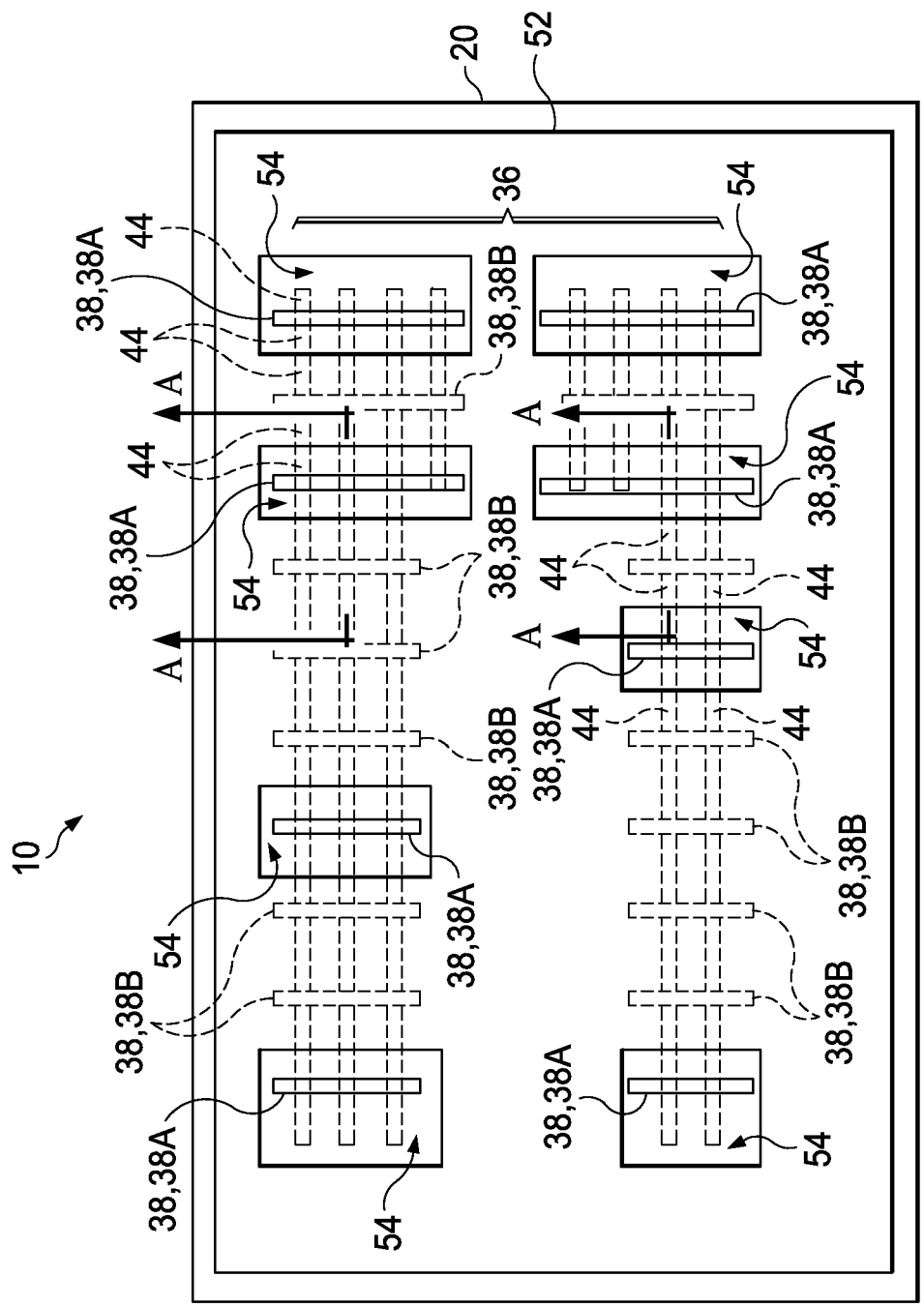

Referring to FIG. 8A, photo resist 52 is formed. Photo resist 52 is patterned, and opening 54 is formed in photo resist 52. Opening 54 overlaps fin portion 36A, which is between FinFETs 100 and 200. Dummy gate stack 38A is thus exposed. On the other hand, dummy gate electrode 38B is covered. FIG. 8B illustrates a top view of the structure shown in FIG. 8A, wherein the view shown in FIG. 8A may also be obtained from each of the planes crossing lines A-A in FIG. 8B. As shown in FIG. 8B, photo resist 52 has a plurality of openings 54, which is used in subsequent steps to form isolation regions, which are used to cut long fins 36 into shorter fins, so that the FinFETs on the same long fins 36 are isolated from each other.

Figure 9:
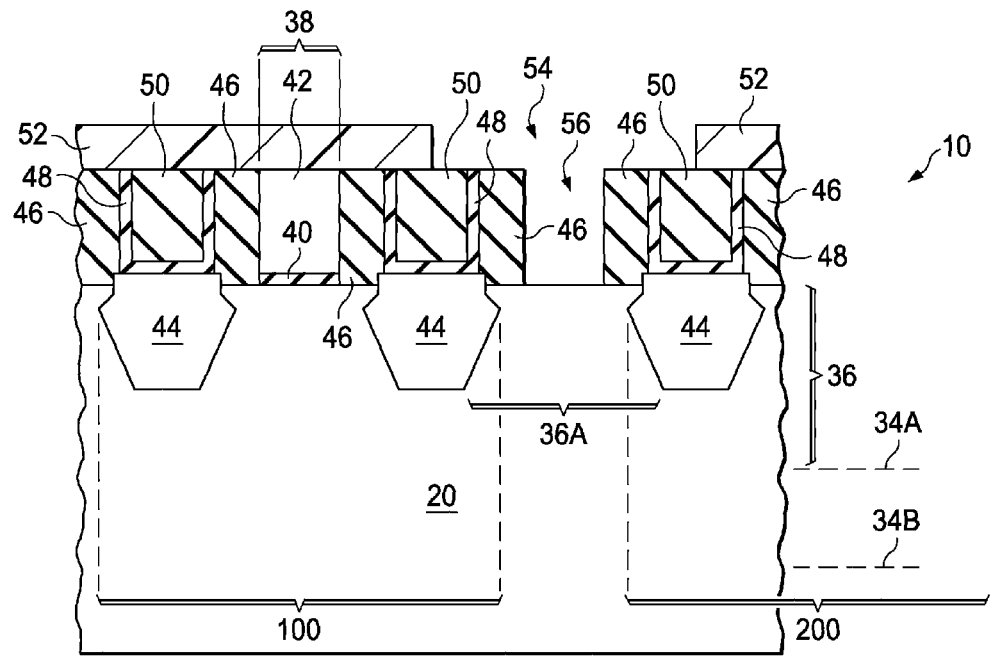
Figure 10:
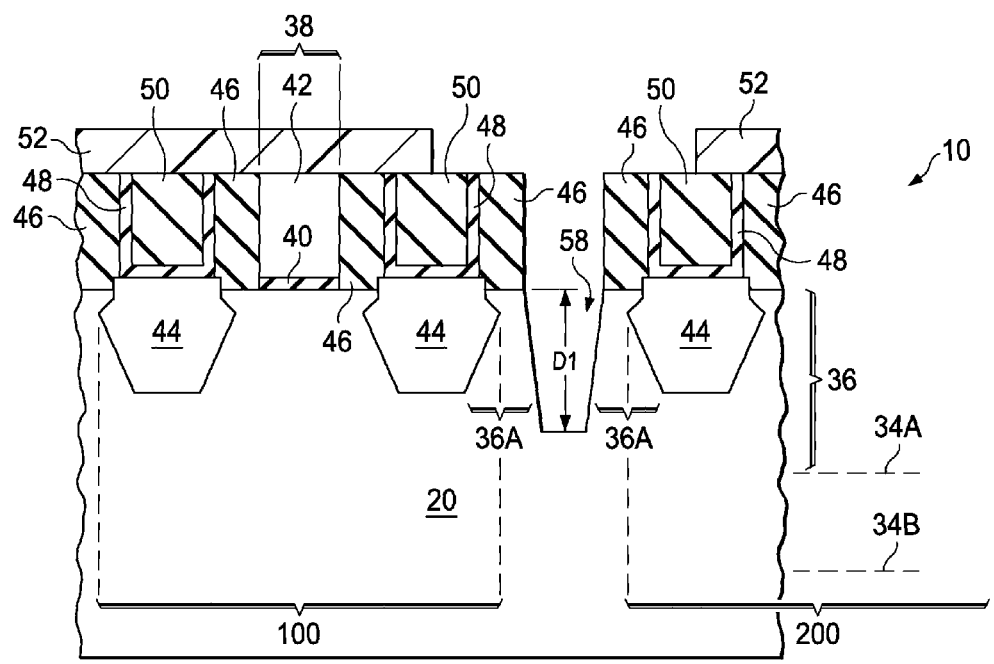

Dummy gate stack 38A (FIG. 8A), which is exposed through opening 54, is removed through etching, forming opening 56. The resulting structure is shown in FIG. 9. The top surface of fin portion 36A is exposed through opening 56. Next, as shown in FIG. 10, fin portion 36A is etched to form recess 58 in fin 36. In some embodiments, the bottom surface of recess (trench) 58 is higher than bottom surface 34B of STI region 34. Furthermore, the bottom surface of recess 58 may also be higher than (or level with or lower than) top surface 34A of STI region 34. Making the bottom surface of recess 58 to be higher than top surface 34A may reduce the process difficulty in the gap-filling of recess 58. Experiment results indicate that when the depth D1 of recess 58 is greater than about 50 nm, the isolation ability of the resulting isolation structure is saturated, although the bottom of the isolation structure may still be higher than top surface 34A. Photo resist 52 is then removed.

Figure 11:
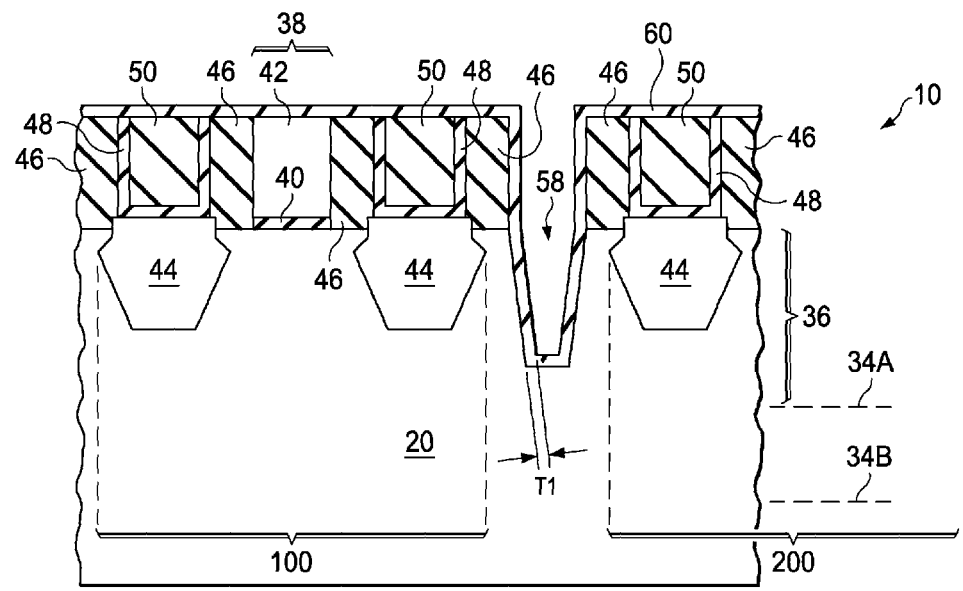

Referring to FIG. 11, liner dielectric 60 is formed, for example, through Chemical Vapor Deposition (CVD), which may be Plasma Enhance CVD (PECVD), Atomic Layer Deposition (ALD), or the like. Liner dielectric 60 may be a conformal layer, whose vertical portions and horizontal portions have substantially the same thickness. In some embodiments, liner dielectric 60 comprises silicon nitride, silicon oxynitride, silicon carbide, or the like. Thickness T1 of liner dielectric 60 may be between about 1 nm and about 5 nm. It is appreciated, however, that the values recited throughout the description are merely examples, and may be changed to different values.

Figure 12:
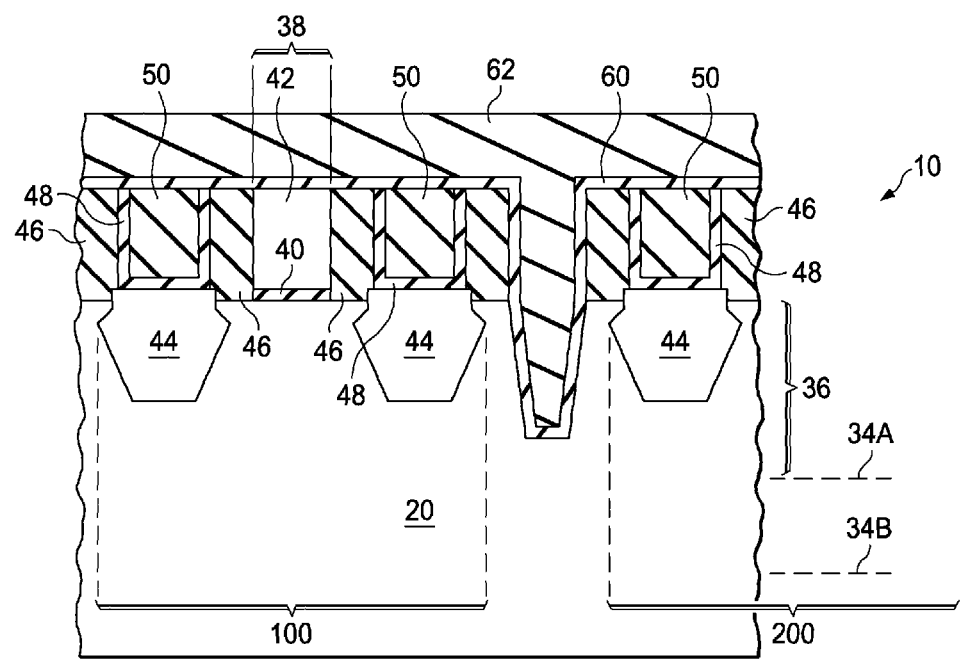
Figure 13:
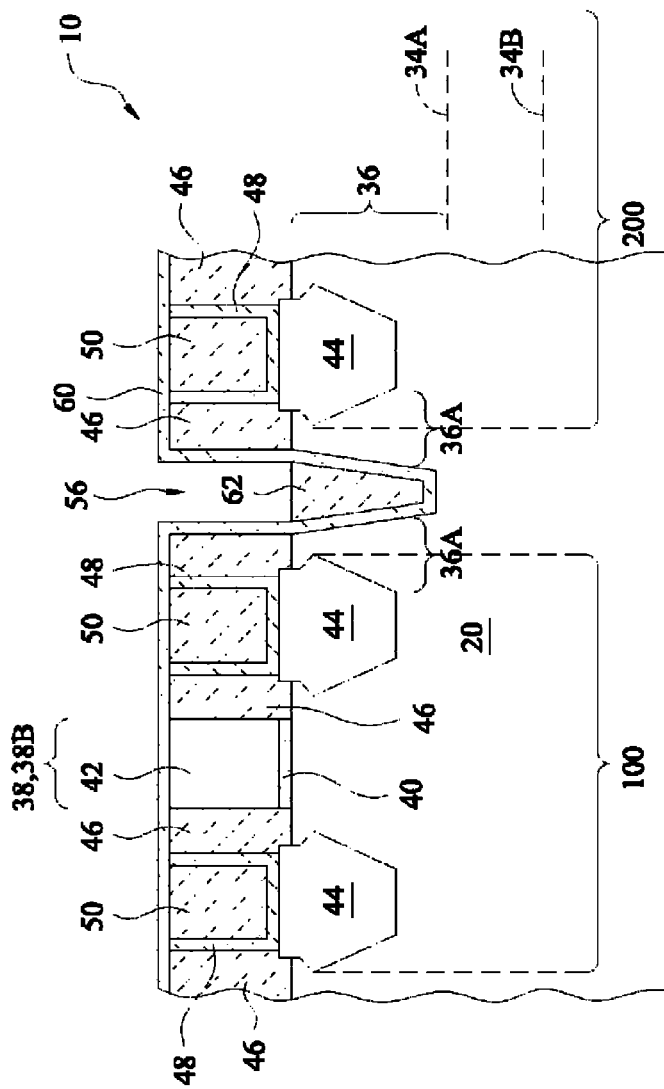

Next, the remaining recess 58 is filled with dielectric material 62, as shown in FIG. 12. The deposition may include spin on coating, Flowable Chemical Vapor Deposition (FCVD), or the like. In some embodiments, dielectric material 62 comprises silicon oxide, although different materials may be used. A CMP may then be performed, for example, using liner dielectric 60 or dummy gate electrode 42 as a CMP stop layer. A recessing of dielectric material 62 is then performed. The resulting structure is shown in FIG. 13. Dielectric material 62 has a top surface substantially level with the top surface of fin 36, although the top surface of dielectric material 62 may also be higher or lower.

Figure 14:
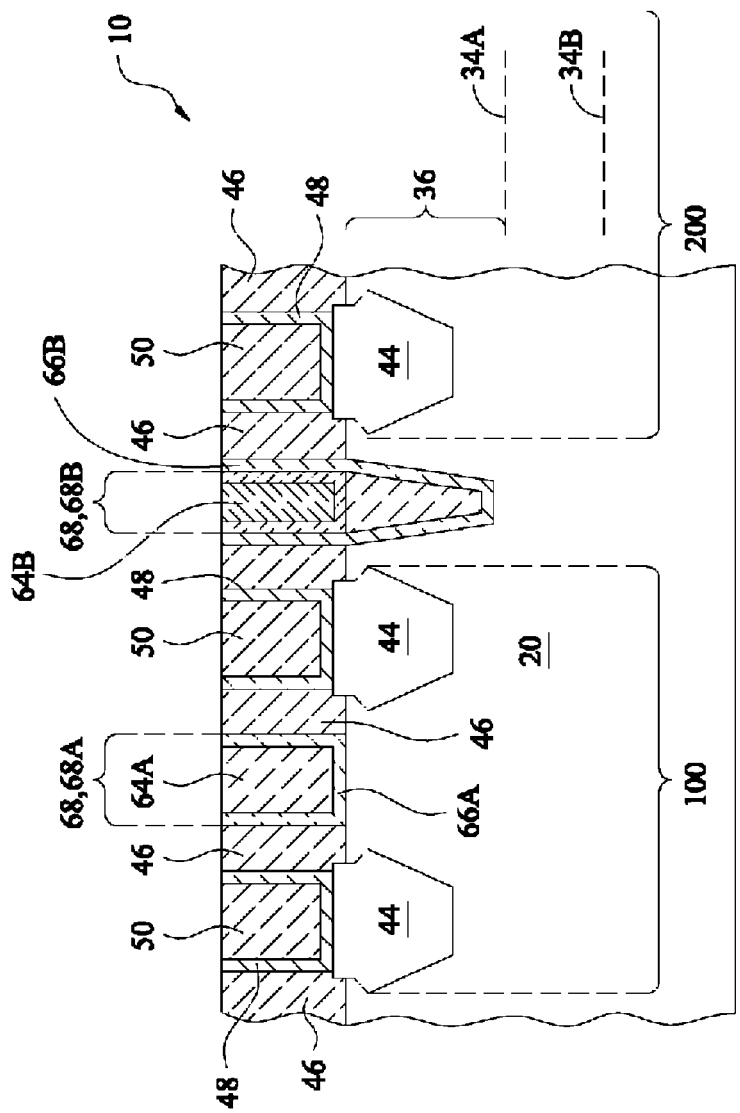

FIG. 14 illustrates the formation of gates 68 (including replacement gate 68A and dummy replacement gate 68B). The formation include removing dummy gate stack 38B in FIG. 13, and forming replacement gate 68A and dummy replacement gate 68B in openings simultaneously. In the final circuits when the circuits are used (powered on), dummy replacement gate 68B may not be connected to the overlying metal vias and metal lines (not shown), and may be, or may not be, electrically floating. Replacement gate 68A is electrically connected to other parts of the respective integrated circuits. The formation of replacement gate 68A and dummy replacement gate 68B may include forming a blanket gate dielectric layer, which may be a high-k dielectric material with a k value higher than about 7.0, and forming a blanket metal layer over the blanket gate dielectric layer. A CMP is then performed to remove excess portions of the blanket gate dielectric layer and the blanket metal layer. The remaining portions of the blanket gate dielectric layer form gate dielectric 66A and dummy gate dielectric 66B, and the remaining portions of the blanket metal layer form metal gate 64A and dummy metal gate 64B.

Figure 15:
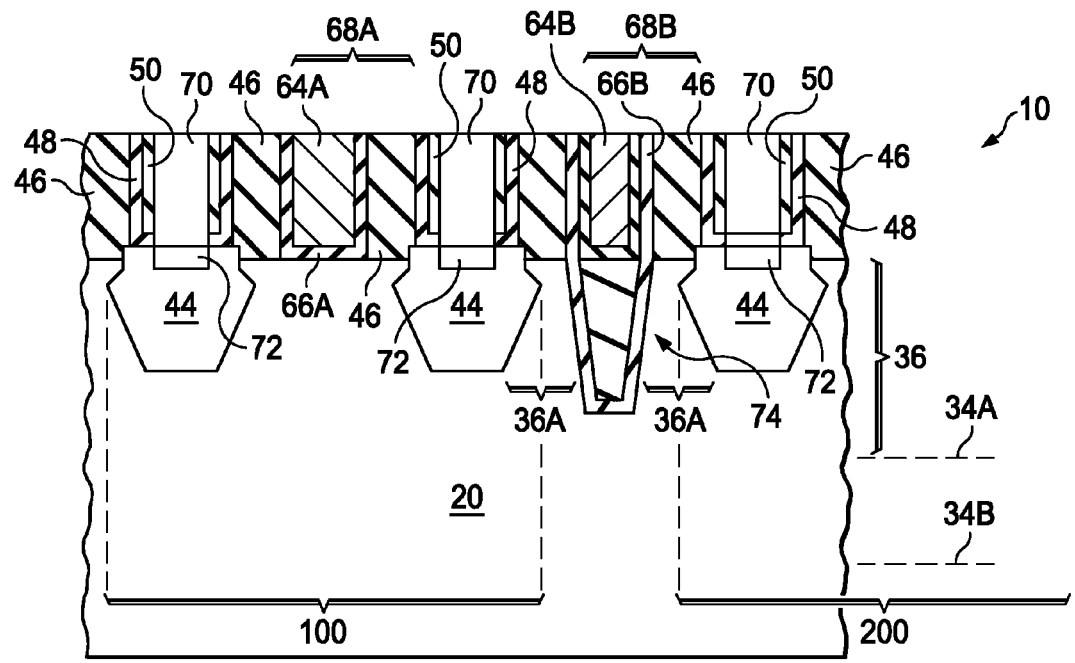

FIG. 15 illustrates the formation of source/drain contact plugs 70 and source/drain silicide regions 72. The formation processes may comprise etching ILD 50 and CESL 48 to form contact openings, performing a silicidation on source/drain regions 44 to form silicide regions 72, and filling the contact openings to form source/drain contact plugs 70.

In FIG. 15, FinFETs 100 and 200 are formed. FinFETs 100 and 200 are isolated from each other by isolation region 74, which extends into fin 36. As shown in FIG. 15, the bottom surface of isolation region 74 is higher than bottom surface 34B of STI regions 34, and may also be higher than, level with, or lower than, top surface 34A of STI regions 34. FinFETs 100 and 200 are formed based on the same fin 36, and hence the lengthwise directions of the fins of FinFETs 100 and 200 overlap with each other. For example, if vertical planes are formed in the channel length directions to cut through the middle lines of the fins of FinFETs 100 and 200, the vertical plane formed from the fin of FinFET 100 and the vertical plane formed from the fin of FinFET 200 overlap with each other.

Figure 16:
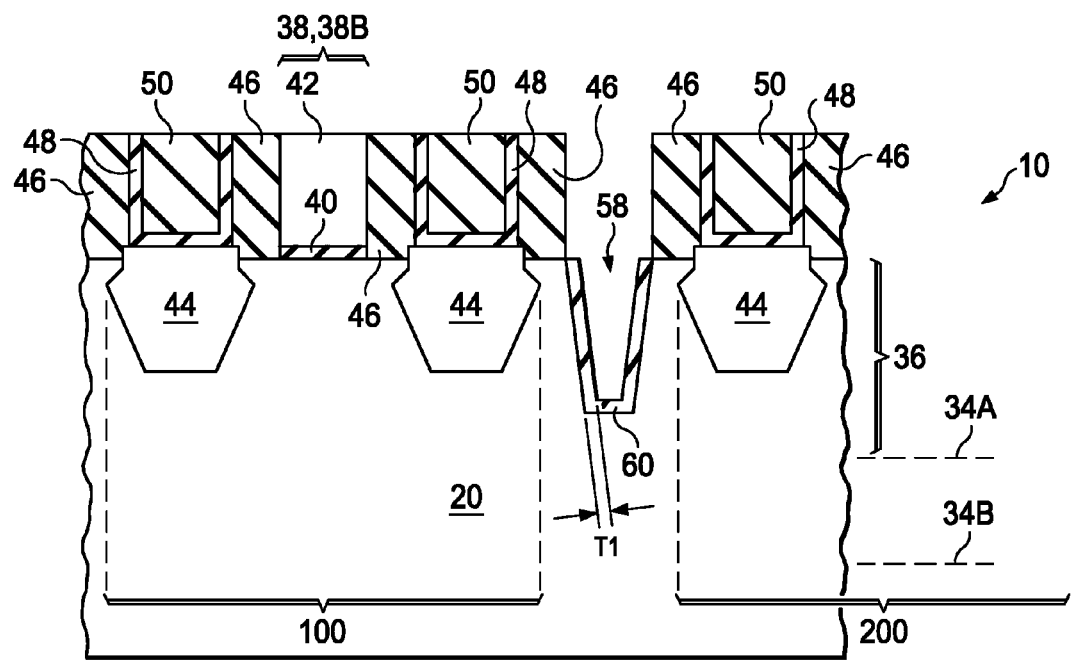
FIGS. 16 through 18 are cross-sectional views of intermediate stages in the manufacturing of FinFETs in accordance with alternative embodiments.
Figure 17:
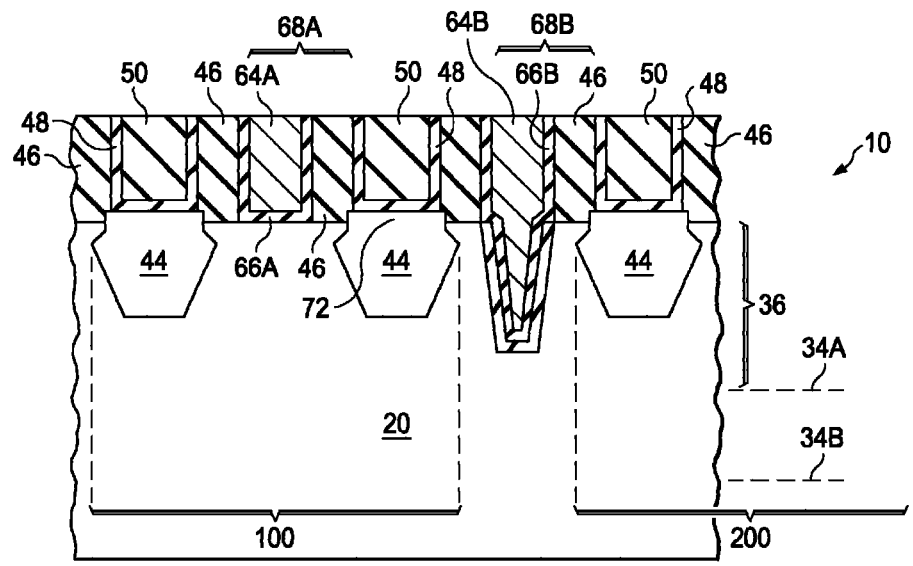
Figure 18:
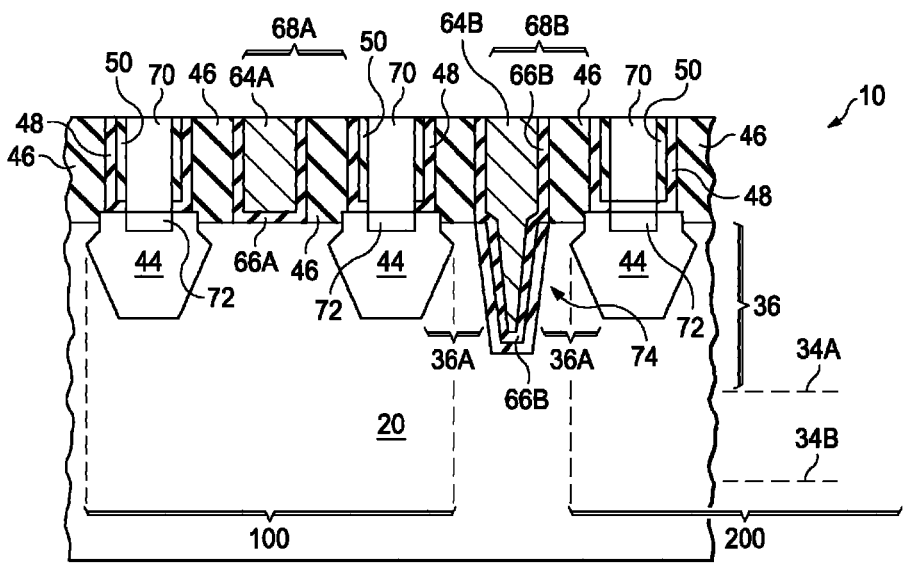

FIGS. 16 through 18 illustrate cross-sectional views of intermediate stages in the formation of FinFETs in accordance with alternative embodiments. Unless specified otherwise, the materials and formation methods of the components in these embodiments are essentially the same as the like components, which are denoted by like reference numerals in the embodiments shown in FIGS. 1 through 15. The details regarding the formation process and the materials of the components shown in FIGS. 16 through 18 (and the embodiments in FIGS. 19A through 23) may thus be found in the discussion of the embodiment shown in FIGS. 1 through 15.

The initial steps of these embodiments are essentially the same as shown in FIGS. 1 through 10, wherein opening 58 is formed in fin 36. Next, photo resist 52 in FIG. 10 is removed. In a subsequent step, as shown in FIG. 16, liner dielectric 60 is formed in recess 58 through a thermal oxidation of fin 36, wherein a surface layer of the exposed portions of fin 36 is oxidized to form an oxide, which may be silicon oxide in some embodiments. In these embodiments, liner dielectric 60 does not extend on the sidewalls and the top surfaces of gate spacers 46 and the top surfaces of dummy gate electrodes 42. Thickness T1 of liner dielectric 60 may be greater than about 3 nm in some embodiments to ensure good isolation between fin 36 and the subsequently dummy gate formed in recess 58.

Next, dummy gate electrode 38B is removed, and the resulting opening and opening 58 in FIG. 16 are filled with replacement gates 68 (including replacement gate 68A and dummy replacement gate 68B), with the resulting structure shown in FIG. 17. The formation of replacement gates 68 may be essentially the same as in FIG. 14. Next, as shown in FIG. 18, source/drain contact plugs 70 and source/drain silicide regions 72 are formed to finish the formation of FinFETs 100 and 200.

In the embodiments shown in FIG. 18, FinFETs 100 and 200 are isolated from each other by isolation region 74. In these embodiments, isolation region 74 includes an oxide layer (liner dielectric 62), dummy gate dielectric 66B, and dummy gate electrode 64B, wherein dummy gate electrode 64B is a dummy metal electrode in some embodiments.

FIGS. 19A through 23 illustrate the formation of FinFETs 100 and 200 in accordance with yet alternative embodiments. These embodiments differs from the embodiments in FIGS. 8 through 18 in that instead of recessing fin 36, and forming the isolation regions in the respective recesses, a portion of fin 36 is oxidized to form the isolation region.

Figure 19A:
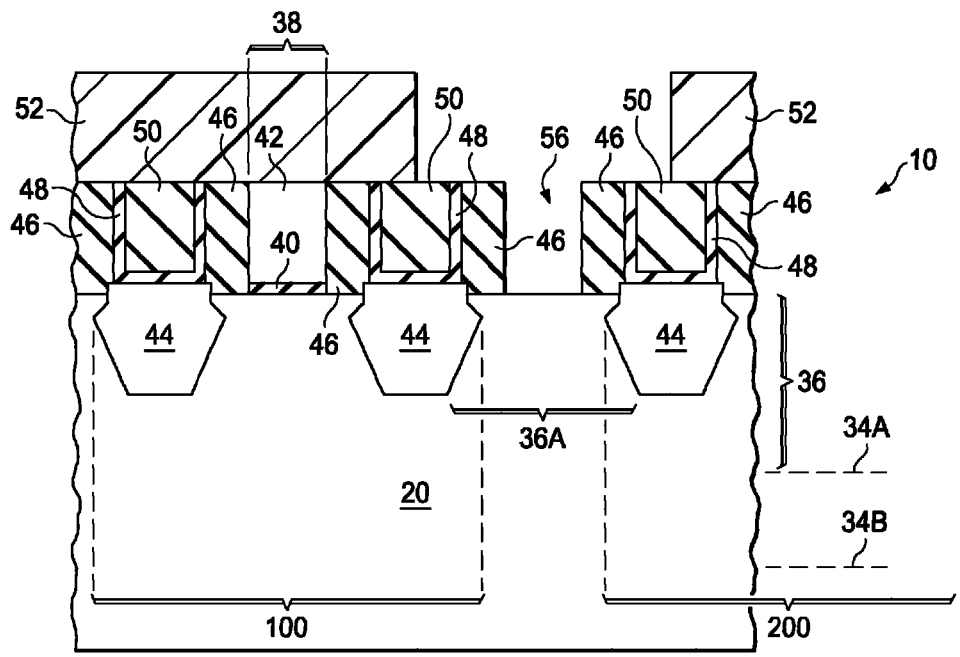
FIGS. 19A through 23 are cross-sectional views of intermediate stages in the manufacturing of FinFETs in accordance with yet alternative embodiments.
Figure 19B:
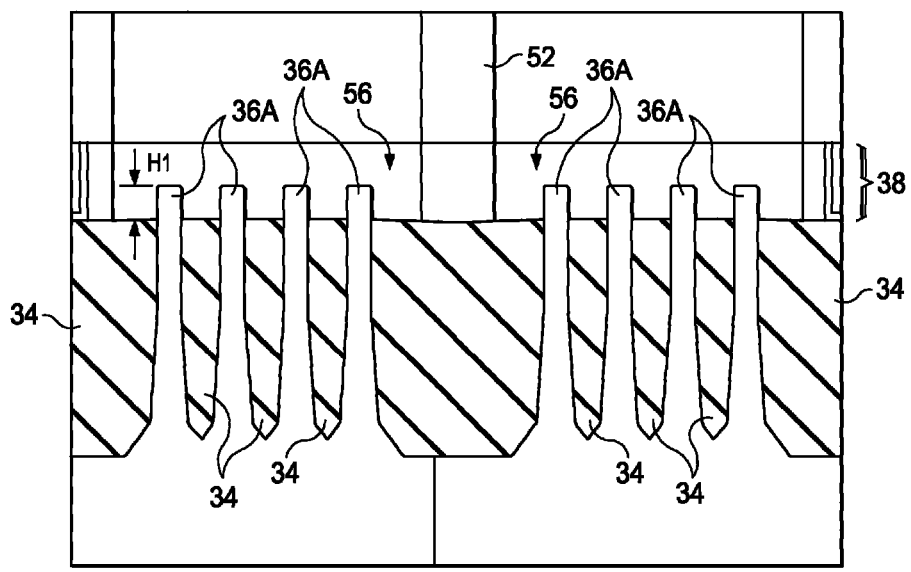
Figure 19C:
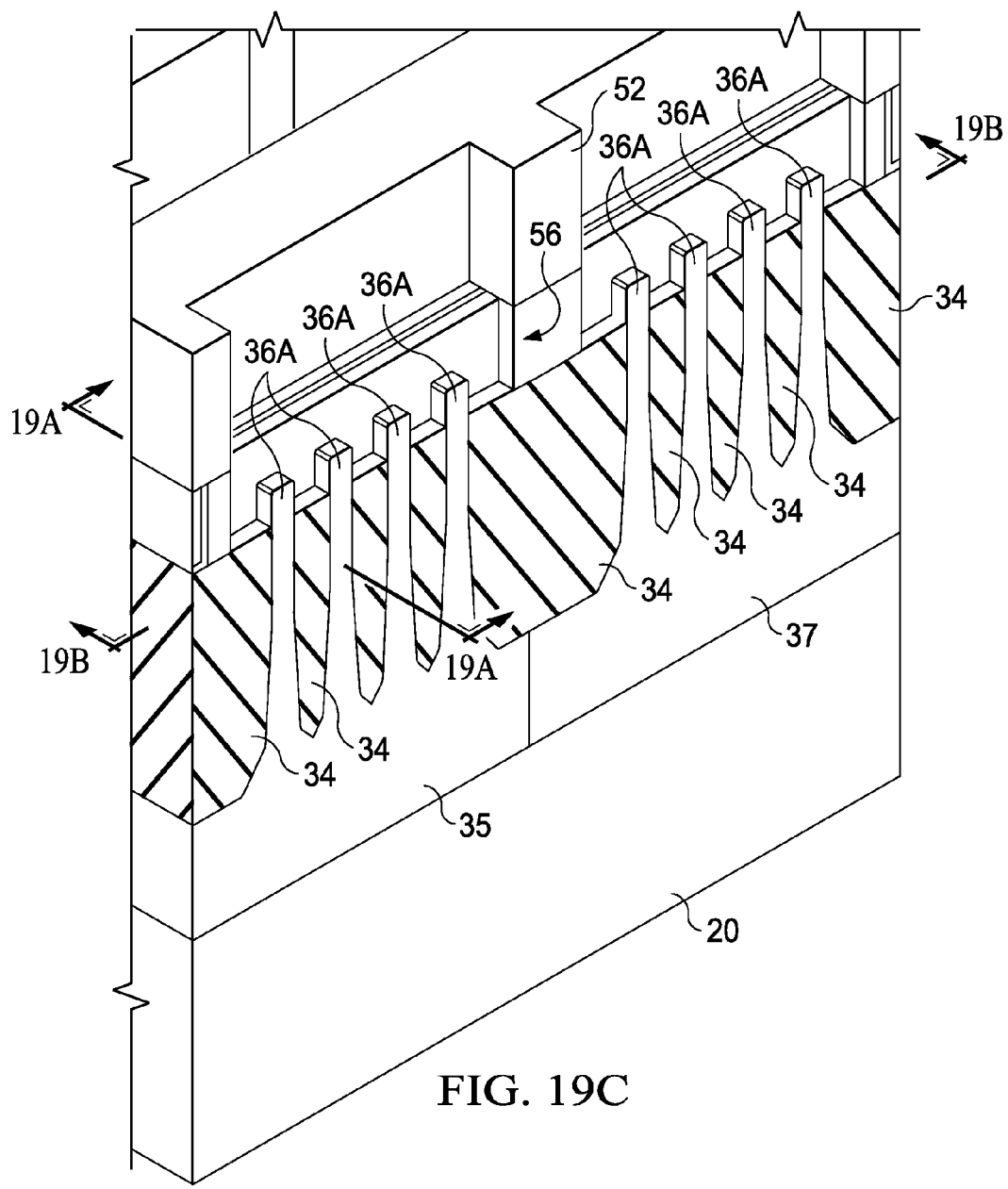

The initial steps of these embodiments are essentially the same as shown in FIGS. 1 through 9. FIGS. 19A, 19B, and 19C illustrate the respective structure, wherein the structure shown in FIG. 19A is essentially the same as in FIG. 9. FIG. 19C illustrates a perspective view, and FIGS. 19A and 19B are the cross-sectional views obtained from the vertical planes containing lines 19A-19A and 19B-19B, respectively, in FIG. 19C. As shown in FIGS. 19A, 19B, and 19C, portions 36A of fins 36 are exposed through opening 56, wherein fin portions 36A protrude above the top surface of STI regions 34 between neighboring fins 36.

Figure 20A:
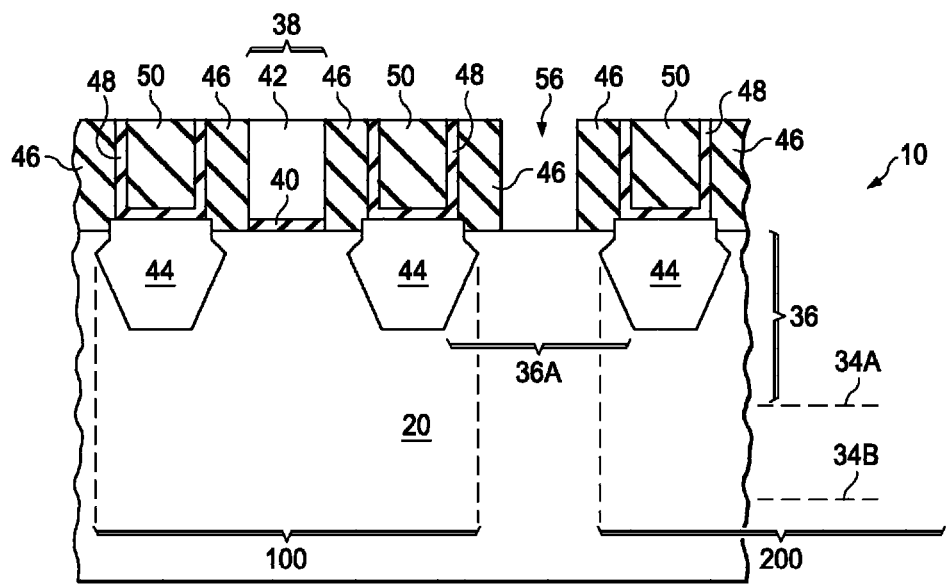
Figure 20B:
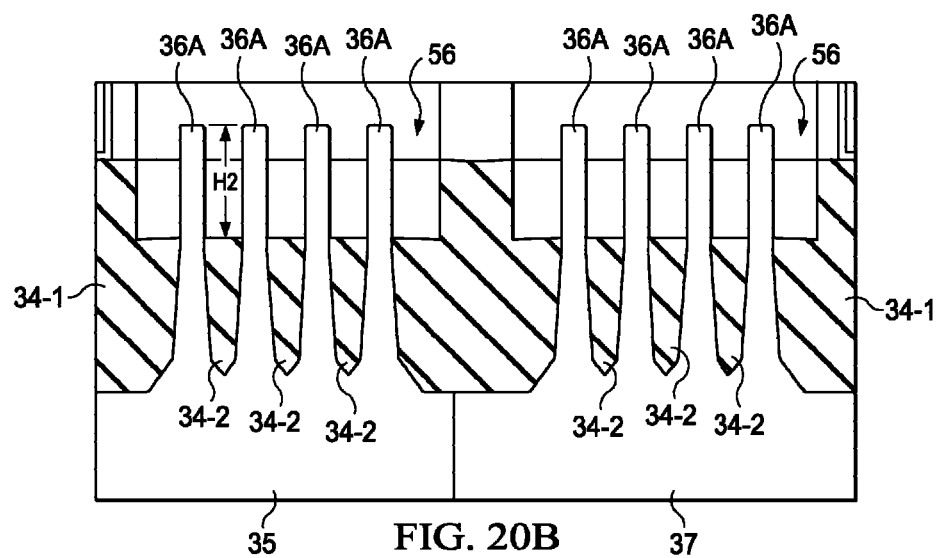
Figure 20C:
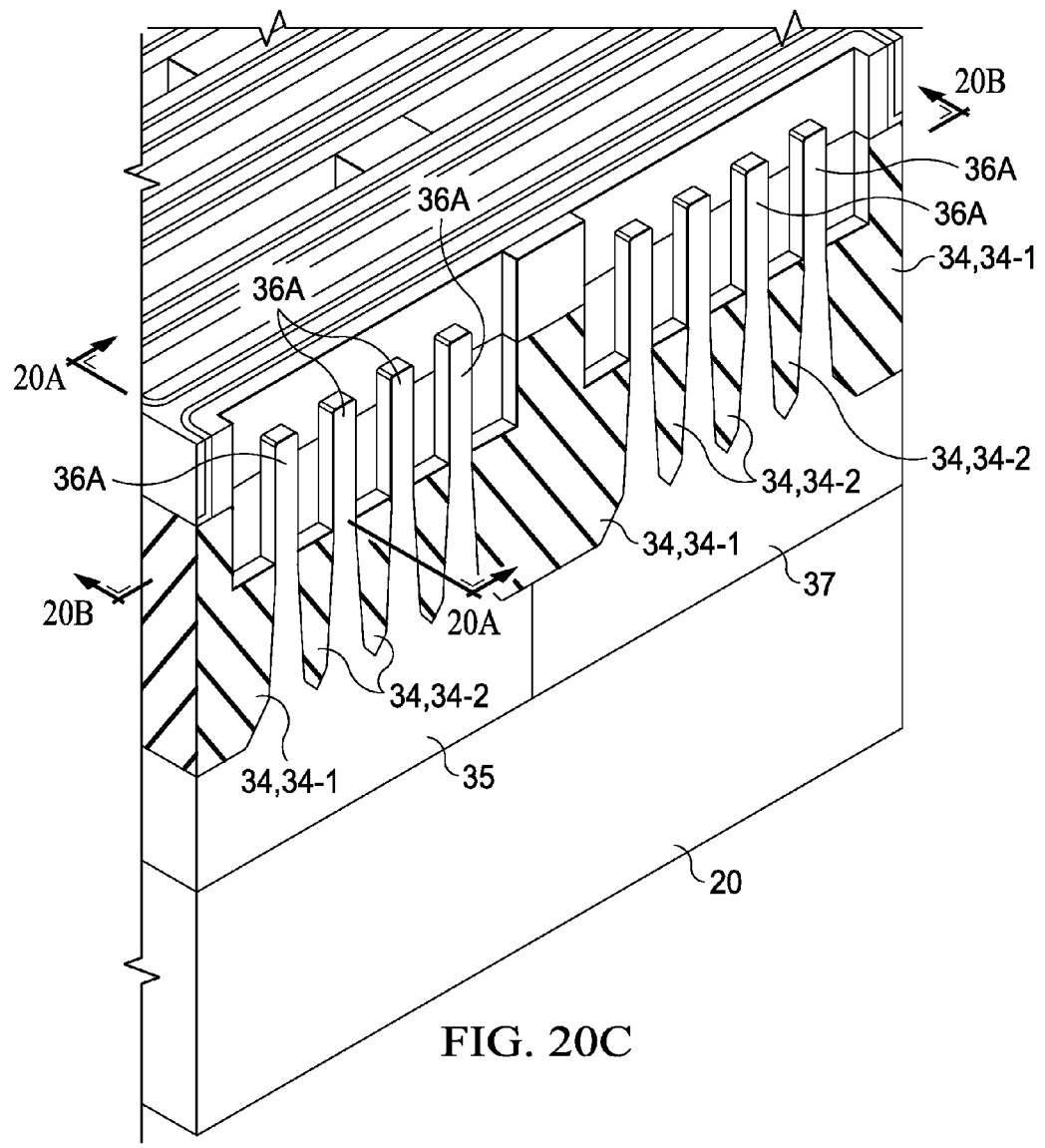

Next, as shown in FIGS. 20A, 20B, and 20C, STI regions 34 are recessed. FIG. 20C illustrates a perspective view, and FIGS. 20A and 20B are the cross-sectional views obtained from the vertical planes containing lines 20A-20A and 20B-20B, respectively, in FIG. 20C. It is appreciated that STI regions 34 include portions 34-1 that separate neighboring p-well region 37 and n-well region 35, and portions 34-2 that separate neighboring closely located fins 36, as shown in FIG. 20B. In the recessing step, portions 34-2 and parts of portions 34-1 are recessed, so that fin portions 36 become higher, and their thicknesses are much smaller than their heights. Height H1 of fin portions 36 (FIG. 19B) is also increased to H2 in FIG. 20B. In some embodiments, height H1 is between about 10 nm and about 35 nm, and height H2 is between about 40 nm and about 85 nm. Ratio H2/H1 may be in the range between about 2 and 4, for example.

Figure 21A:
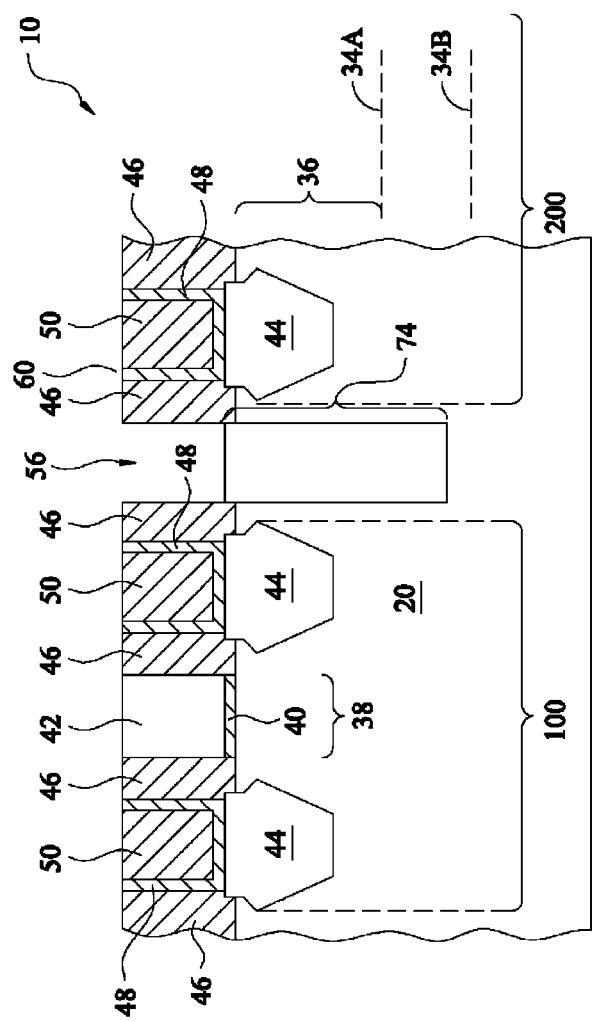
Figure 21B:
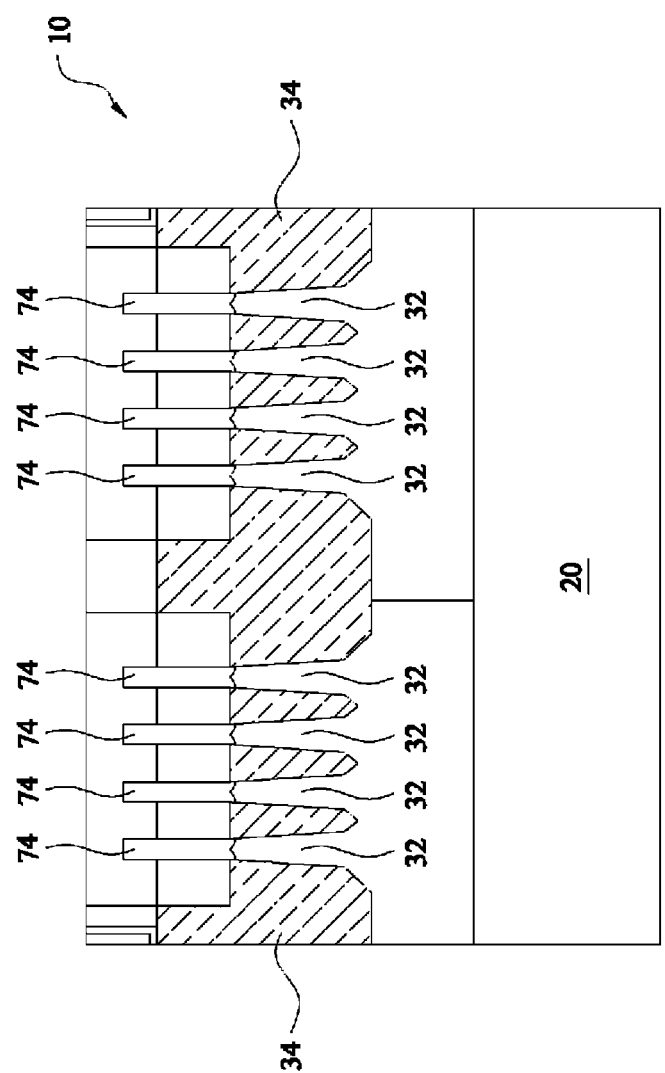
Figure 21C:
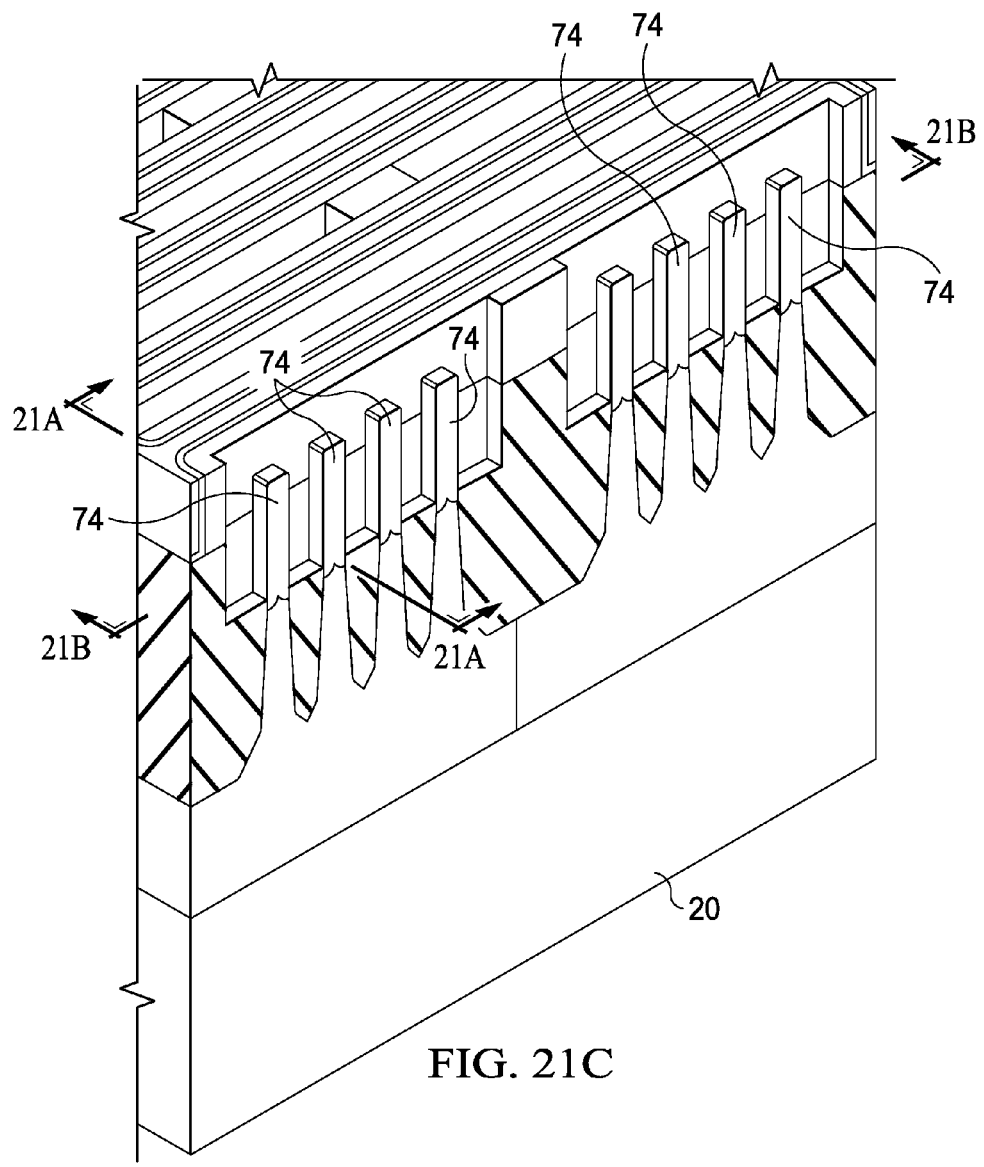

The exposed portions of fin portions 36A are oxidized to form isolation regions 74, as shown in FIGS. 21A, 21B, and 21C. Isolation regions 74 are silicon oxide regions in some exemplary embodiments. Isolation regions 74 are formed of a homogenous oxide, which is the oxide of the semiconductor material of fin 36 (silicon, for example). FIG. 21C illustrates a perspective view, and FIGS. 21A and 21B are the cross-sectional views obtained from the vertical planes containing lines 21A-21A and 21B-21B, respectively, in FIG. 21C. Since fin portions 36A (FIG. 20C) are above the top surfaces of STI regions 34-2, during the oxidation, the entireties of fin portions 36A are converted into oxide regions 74. The recessing step in FIGS. 20A-20C ensures that fin portions 36A are fully oxidized.

Figure 22A:
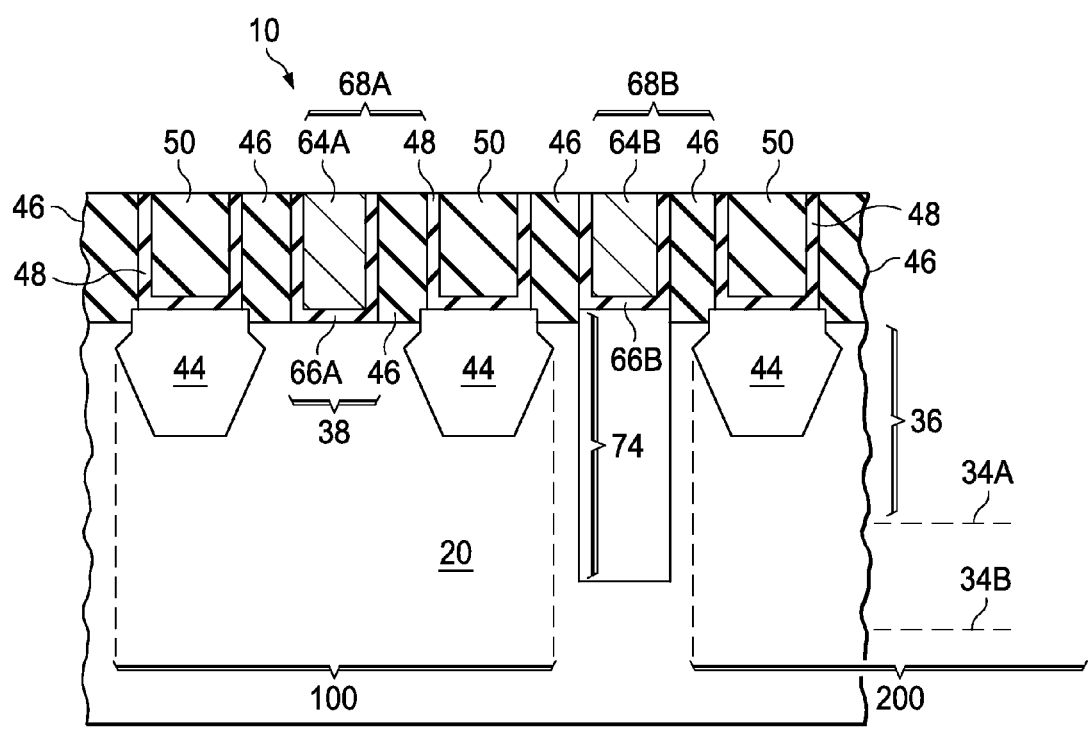
Figure 22B:
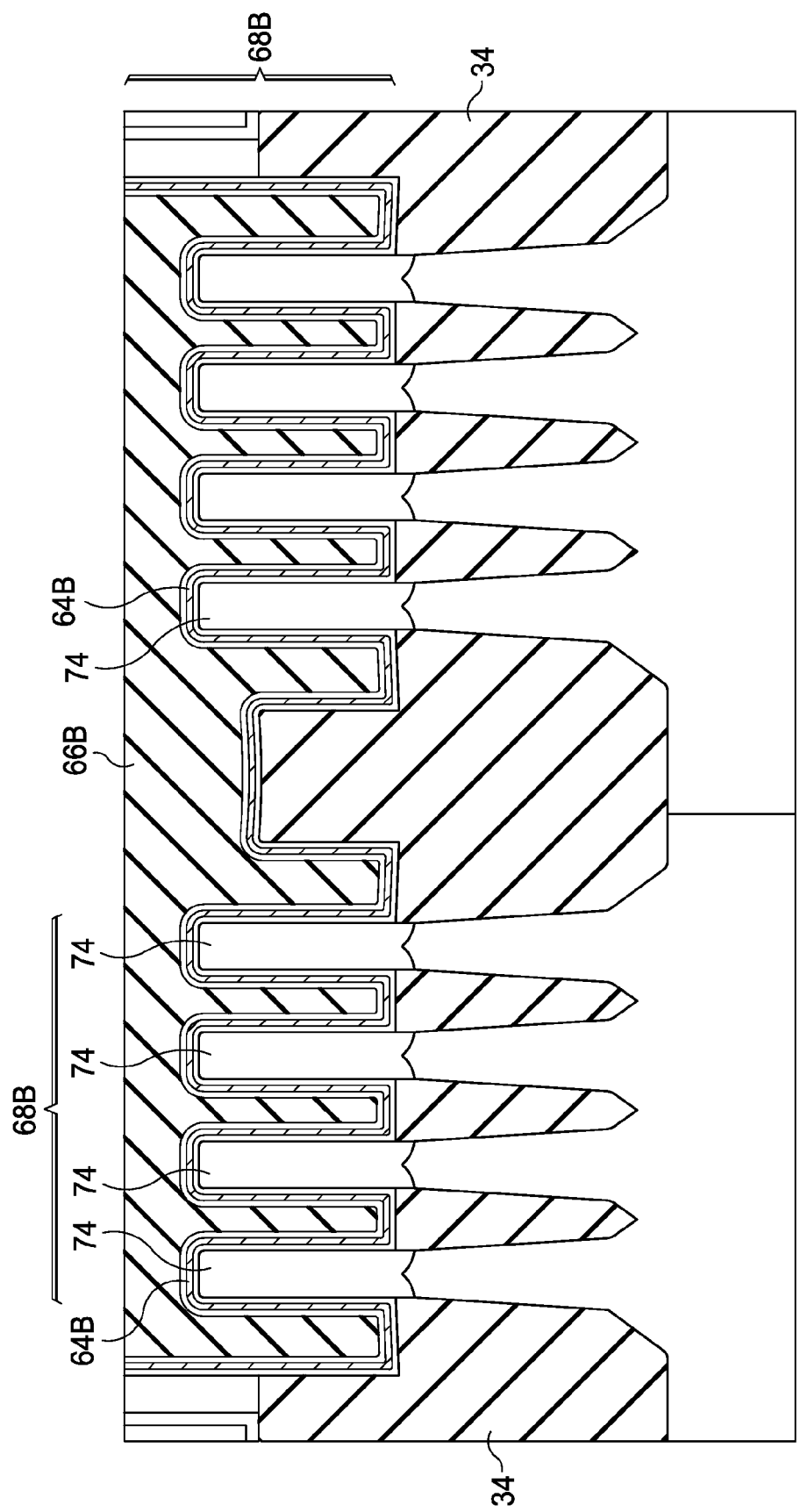
Figure 22C:
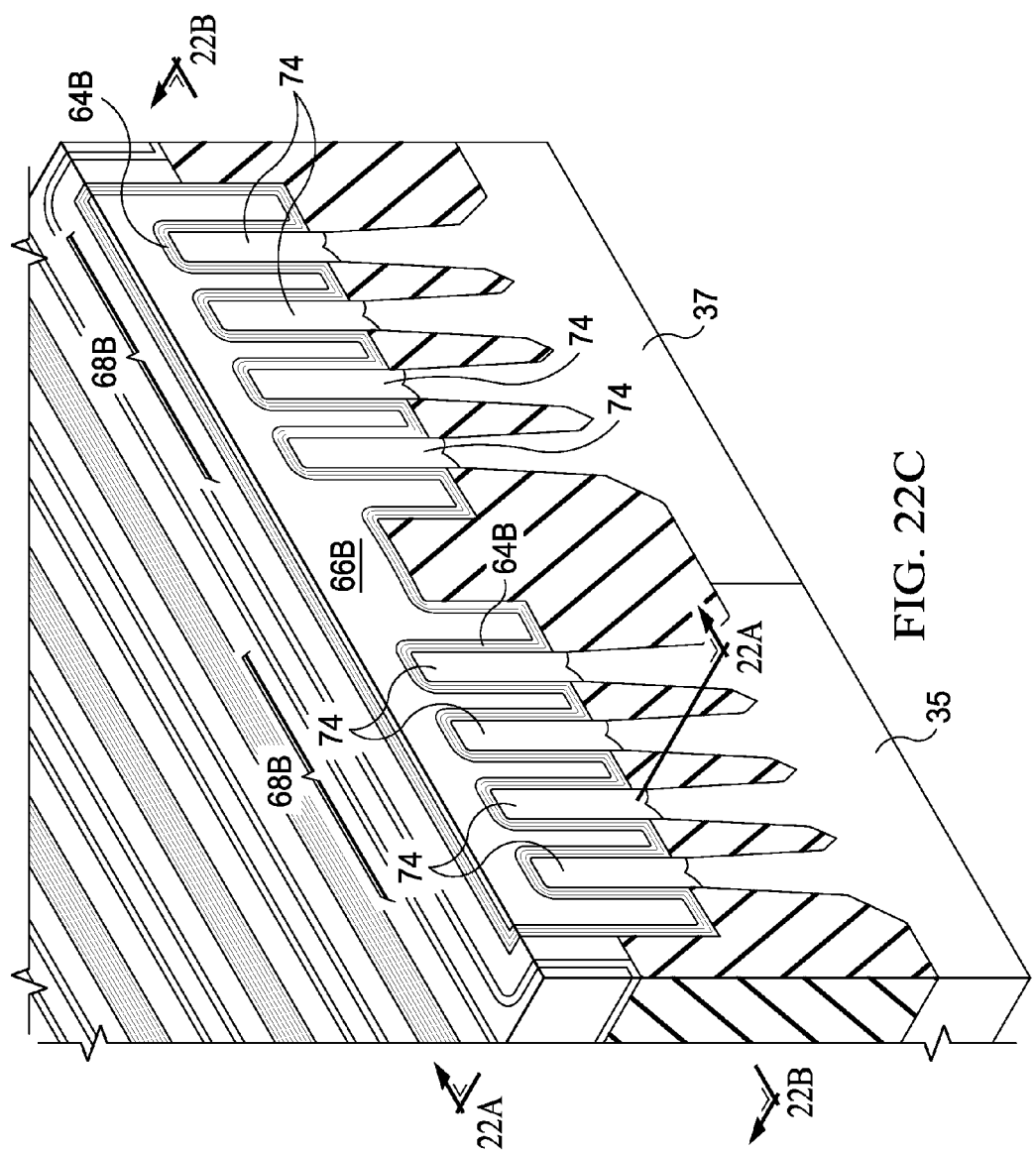
Figure 23:
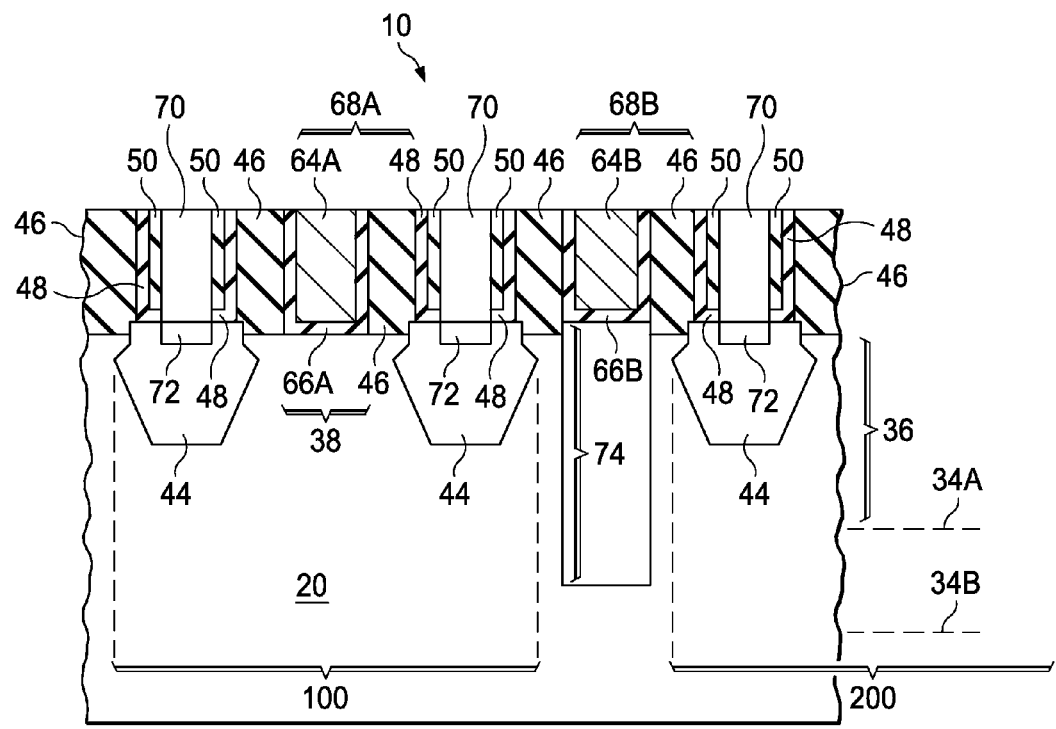

Referring to FIGS. 22A, 22B, and 22C, replacement gate 68A and dummy replacement gate 68B are formed. FIG. 22C illustrates a perspective view, and FIGS. 22A and 22B are the cross-sectional views obtained from the vertical planes containing lines 22A-22A and 22B-22B, respectively, in FIG. 22C. The formation details are the same as described for FIG. 14, and are not repeated herein. In these embodiments, the isolation regions 74 are the oxide regions of the original fins 36. In FIG. 23, source/drain contact plugs 70 and source/drain silicide regions 72 are formed to finish the formation of FinFETs 100 and 200.

Figure 24:
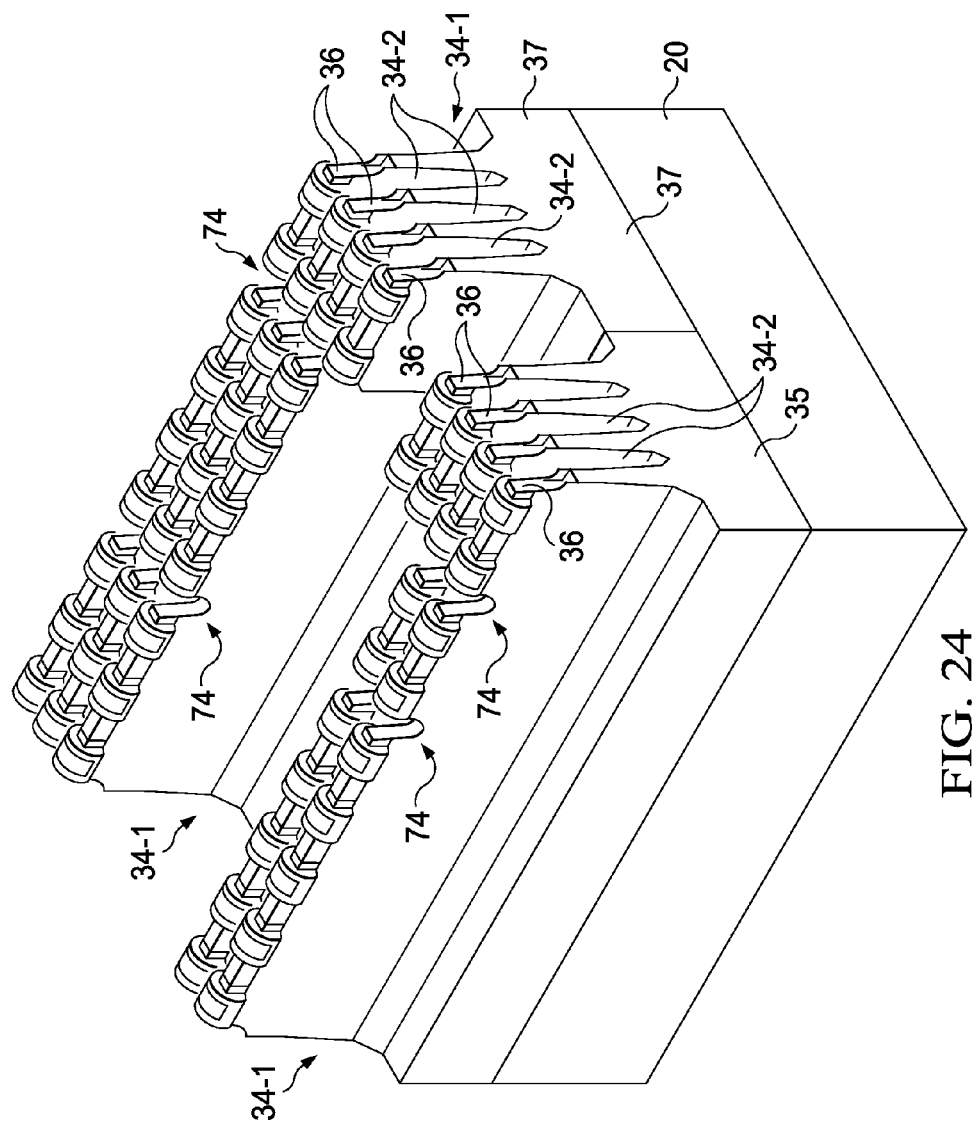
FIG. 24 illustrates a perspective view of FinFETs and the trenches in which the Shallow Trench Isolation (STI) regions and isolation regions are formed.

FIG. 24 illustrates a perspective view of the structure in accordance with the embodiments of the present disclosure. For clarity, the replacement gates, the gate spacers, the ILD, the STI regions, and the isolation regions are not illustrated. The recesses/trenches in which the isolation regions 74, STI portions 34-1, and STI portions 34-2 are formed are illustrated to represent the respective regions 74, 34-1, and 34-2, respectively. STI regions 34-1 are for separating n-well region 35 from p-well region 37. STI regions 34-2 are used for separating neighboring fins 36 that are parallel to each other, wherein the neighboring fins 36 are in the same well region (35 or 37). Isolation regions 74 are used for dividing long fins into smaller fins, so that the plurality of FinFETs formed on the long fins may be separated from each other. As shown in FIG. 24, STI portions 34-1 and STI portions 34-2 are formed simultaneously, and are defined in a same photolithography process (FIGS. 2-4). Isolation regions 74, on the other hand, are defined in the replacement gate formation loop (FIGS. 8-23). As shown in FIG. 24, the bottoms of isolation regions 74 may be lower than the bottoms of STI regions 34. As shown in FIGS. 15, 18, and 23, isolation regions 74 may be spaced apart from neighboring source and drain regions 44 by remaining fin portions 36A. Furthermore, isolation regions 74 and the adjoining STI regions 34-1/34-2 may form distinguishable interfaces due to the use of different materials and formed in different process steps.

In the embodiments of the present disclosure, a long fin, on which a plurality of FinFETs is formed first using a first photolithography process, is separated into smaller fins using a second photolithography process. This is different from conventional processes, in which fins are small fins (as formed) using a single photolithography process. Alternatively stated, in conventional processes, the fins are formed and divided simultaneously. The embodiments of the present disclosure have some advantageous features. For example, since short fins are formed as long fins first, and divided later, the line-end shortening and rounding effect is at least reduced, and possibly eliminated. Furthermore, in conventional SiGe formation, one side of a SiGe region may be silicon, and another side of SiGe may be STI. Since SiGe has the tendency not to form on STI, severe faceting effect was observed. In the embodiments of the present disclosure, since SiGe regions are formed with both sides joining silicon, no facet effect will occur.

In accordance with some embodiments, an integrated circuit structure includes a first FinFET and a second FinFET adjacent to each other. Each of the first FinFET and the second FinFET includes a semiconductor fin, a gate dielectric on sidewalls and a top surface of the semiconductor fin, and a gate electrode over the gate dielectric. The semiconductor fin of the first FinFET and the semiconductor fin of the second FinFET are aligned to a straight line. An isolation region is aligned to the straight line, wherein the isolation region includes a portion at a same level as the semiconductor fins of the first FinFET and the second FinFET. A continuous straight semiconductor strip is overlapped by the semiconductor fins of the first FinFET and the second FinFET. An STI region is on a side of, and contacts, the semiconductor strip. The isolation region and the first STI region form a distinguishable interface.

In accordance with other embodiments, an integrated circuit structure includes a first and a second FinFET. The first FinFET includes a first semiconductor fin, a first gate dielectric on sidewalls and a top surface of the first semiconductor fin, a first gate electrode over the first gate dielectric, and a first source/drain region on a side of the first gate electrode. The second FinFET includes a second semiconductor fin, a second gate dielectric on sidewalls and a top surface of the second semiconductor fin, a second gate electrode over the second gate dielectric, and a second source/drain region on a side of the second gate electrode. An isolation region includes a portion at a same level as the first semiconductor fin and the second semiconductor fin. A semiconductor fin portion is between, and contacts, the isolation region and the first source/drain region. A top surface of the semiconductor fin portion and top surfaces of the first semiconductor fin and the second semiconductor fin are co-planar.

In accordance with yet other embodiments, a method includes forming a straight semiconductor fin, forming a plurality of dummy gate stacks over the straight semiconductor fin, and forming a plurality of sourced/drain regions extending into the straight semiconductor fin. The plurality of dummy gate stacks and the plurality of sourced/drain regions are allocated in an alternating layout. After forming the plurality of dummy gate stacks and the plurality of sourced/drain regions, an isolation region is formed to extend into the straight semiconductor fin to separate the straight semiconductor fin into short fins.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. An integrated circuit structure comprising:
    A first Fin Field-Effect Transistor (FinFET) and a second FinFET adjacent to each other, wherein each of the first FinFET and the second FinFET comprises:
        a semiconductor fin;
        a gate dielectric on sidewalls and a top surface of the semiconductor fin;
        a gate electrode over the gate dielectric, wherein the semiconductor fin of the first FinFET and the semiconductor fin of the second FinFET are aligned to a straight line; and
        source and drain region on opposite sides of the gate electrode;
    an isolation region aligned to the straight line, wherein the isolation region comprises a portion at a same level as the semiconductor fins of the first FinFET and the second FinFET, and the isolation region comprises:
        a dummy metal gate; and
        a liner oxide of the semiconductor fin, wherein the liner oxide separates the dummy metal gate apart from source and drain regions of the first FinFET and the second FinFET;
    a continuous straight semiconductor strip overlapped by the semiconductor fins of the first FinFET and the second FinFET; and
    a first Shallow Trench Isolation (STI) region on a side of, and contacting, the continuous straight semiconductor strip, wherein the isolation region and the first STI region form a distinguishable interface.

2. The integrated circuit structure of claim 1, wherein the isolation region has a first bottom surface, and the first STI region has a second bottom surface lower than the first bottom surface.

3. The integrated circuit structure of claim 1, wherein the isolation region comprises:
an oxide; and
a dielectric layer surrounding the oxide and extending underlying the oxide, wherein the dielectric layer and the oxide comprise different materials.

4. The integrated circuit structure of claim 1 further comprising:
a first well region;
a second well region; and
a second STI region separating the first well region from the second well region, wherein the second STI region has a second top surface, wherein the first STI region has a first top surface lower than the second top surface, and wherein the isolation region is formed of an oxide of a same material of the semiconductor fin.

5. The integrated circuit structure of claim 4 further comprising:
a dummy metal gate comprises portions on opposite sides of, and level with, the isolation region; and
a high-k dielectric comprising portions separating the dummy metal gate from the isolation region, wherein the high-k dielectric is in contact with the dummy metal gate and the isolation region.

6. The integrated circuit structure of claim 1 further comprising:
a semiconductor fin portion between, and contacting, the isolation region and a source/drain region of the first FinFET, wherein the semiconductor fin portion is aligned to the straight line.

7. An integrated circuit structure comprising:
a first Fin Field-Effect Transistor (FinFET) comprising:
a first semiconductor fin;
a first gate dielectric on sidewalls and a top surface of the first semiconductor fin;
a first gate electrode over the first gate dielectric; and
a first source/drain region on a side of the first gate electrode;
a second FinFET comprising:
a second semiconductor fin;
a second gate dielectric on sidewalls and a top surface of the second semiconductor fin;
a second gate electrode over the second gate dielectric; and
a second source/drain region on a side of the second gate electrode;
an isolation region, wherein the isolation region comprises a portion at a same level as the first semiconductor fin and the second semiconductor fin, wherein the isolation region comprises a homogeneous oxide, and the homogeneous oxide is an oxide of a same material of the first semiconductor fin;
a first semiconductor fin portion between, and contacting, the isolation region and the first source/drain region, wherein a top surface of the first semiconductor fin portion and top surfaces of the first semiconductor fin and the second semiconductor fin are co-planar;
a dummy metal gate comprising portions on opposite sides of, and level with, the isolation region; and
a high-k dielectric comprising portions separating the dummy metal gate from the homogeneous oxide, wherein the high-k dielectric is in contact with the dummy metal gate and the homogeneous oxide.

8. The integrated circuit structure of claim 7 further comprising:
a straight semiconductor strip overlapped by the first semiconductor fin, the second semiconductor fin, and the first semiconductor fin portion; and
a Shallow Trench Isolation (STI) region on a side of, and contacting, the first semiconductor fin, the second semiconductor fin, and the first semiconductor fin portion.

9. The integrated circuit structure of claim 8, wherein a bottom surface of the isolation region is higher than a bottom surface of the STI region.

10. The integrated circuit structure of claim 7 further comprising a second semiconductor fin portion between, and contacting, the isolation region and the second source/drain region.

11. The integrated circuit structure of claim 7, wherein the first semiconductor fin portion, the first semiconductor fin, and the second semiconductor fin have a same width.

12. The integrated circuit structure of claim 7, wherein the isolation region comprises:
an oxide; and
a dielectric layer surrounding the oxide and extending underlying the oxide, wherein the dielectric layer and the oxide comprise different materials.

13. The integrated circuit structure of claim 7, wherein the isolation region comprises:
a dummy metal gate; and
a liner oxide separating the dummy metal gate apart from the first semiconductor fin portion, wherein the liner oxide is in contact with the dummy metal gate and the first semiconductor fin portion.

14. An integrated circuit structure comprising:
a first Shallow Trench Isolation (STI) region and a second STI region parallel to each other and extending into a semiconductor substrate;
a semiconductor strip between the first STI region and the second STI region, wherein the semiconductor strip comprises a first portion, a second portion, and a third portion connecting the first portion to the second portion;
a first semiconductor fin overlapping the first portion of the semiconductor strip, wherein the first semiconductor fin is over top surfaces of the first STI region and the second STI region;
a second semiconductor fin overlapping the second portion of the semiconductor strip, wherein the first semiconductor fin is over the top surfaces of the first STI region and the second STI region;
an isolation region overlapping the third portion of the semiconductor strip; and
a dummy replacement gate over the isolation region, wherein edges of the dummy replacement gate are aligned with respective edges of the isolation region.

15. The integrated circuit structure of claim 14, wherein opposite edges of the isolation region are in contact with an edge of the first semiconductor fin and an edge of the second semiconductor fin.

16. The integrated circuit structure of claim 14 further comprising a first Fin Field-Effect Transistor (FinFET) formed on the first semiconductor fin, and a second FinFET formed on the second semiconductor fin.

17. The integrated circuit structure of claim 14, wherein the isolation region comprises a bottom higher than a bottom surface of the first STI region.

18. The integrated circuit structure of claim 14, wherein the isolation region comprises a liner dielectric and a dielectric region over a bottom portion of the liner dielectric, wherein the liner dielectric comprises portions on opposite sidewalls of the dielectric region.

19. The integrated circuit structure of claim 6, wherein the semiconductor fin portion and the semiconductor fins of the first FinFET and the second FinFET have substantially a same width measured in a direction perpendicular to a lengthwise direction of the semiconductor fin portion.

20. The integrated circuit structure of claim 14, wherein the first semiconductor fin and the second semiconductor fin have substantially a same width.

* * * * *